(12) United States Patent
Loghin et al.

(10) Patent No.: US 8,775,908 B2
(45) Date of Patent: Jul. 8, 2014

(54) RECEIVER AND RECEIVING METHOD FOR RECEIVING DATA IN A BROADCAST SYSTEM USING INCREMENTAL REDUNDANCY RECEIVED THROUGH A UNICAST SYSTEM

(75) Inventors: Nabil Loghin, Stuttgart (DE); Lothar Stadelmeier, Stuttgart (DE); Joerg Robert, Vreden (DE)

(73) Assignee: Sony Corporation, Tokyo (JP)

( * ) Notice: Subject to any disclaimer, the term of this patent is extended or adjusted under 35 U.S.C. 154(b) by 99 days.

(21) Appl. No.: 13/516,134

(22) PCT Filed: Nov. 30, 2010

(86) PCT No.: PCT/EP2010/068519
§ 371 (c)(1),
(2), (4) Date: Jun. 14, 2012

(87) PCT Pub. No.: WO2011/080020
PCT Pub. Date: Jul. 7, 2011

(65) Prior Publication Data
US 2012/0254684 A1 Oct. 4, 2012

(30) Foreign Application Priority Data
Dec. 21, 2009 (EP) .................................... 09180151

(51) Int. Cl.
*H03M 13/00* (2006.01)
(52) U.S. Cl.
USPC ........................................................ 714/776
(58) Field of Classification Search
None
See application file for complete search history.

(56) References Cited

U.S. PATENT DOCUMENTS

| 7,924,703 | B2 * | 4/2011 | Ji et al. ........................... 370/216 |
| 8,412,999 | B2 * | 4/2013 | Lee et al. ........................ 714/748 |
| 8,553,727 | B2 * | 10/2013 | Tsatsanis et al. ............. 370/480 |
| 8,638,808 | B2 * | 1/2014 | Barr et al. ...................... 370/431 |
| 2001/0056560 | A1 | 12/2001 | Khan et al. |

(Continued)

FOREIGN PATENT DOCUMENTS

| EP | 1 482 671 | 12/2004 |
| EP | 1 734 676 | 12/2006 |

OTHER PUBLICATIONS

Kim, J., et al., "Design of Rate-Compatible Irregular LDPC Codes for Incremental Redundancy Hybrid ARQ Systems," ISIT, pp. 1139-1143 (Jul. 9-14, 2006).

(Continued)

*Primary Examiner* — Daniel McMahon
(74) *Attorney, Agent, or Firm* — Oblon, Spivak, McClelland, Maier & Neustadt, L.L.P.

(57) ABSTRACT

A receiver includes: a broadcast receiver receiving a receiver input data stream segmented into frames, wherein basic codeword portions of codewords are mapped onto the frames, a codeword including at least a basic codeword portion generated from an input data word according to a first code; a data demapper demapping the basic codeword portions; a decoder error correction code decoding the codewords into output data words of at least one output data stream in a regular decoding using the basic codeword portion in a codeword; a check unit checking if the regular decoding of a codeword is erroneous; a unicast request unit requesting, if the regular decoding of a codeword is erroneous, an auxiliary codeword portion of the erroneously decoded codeword for incremental redundancy in an additional decoding; a unicast receiver unit receiving an auxiliary codeword portion of the erroneously decoded codeword.

17 Claims, 11 Drawing Sheets

(56) References Cited

U.S. PATENT DOCUMENTS

| | | | |
|---|---|---|---|
| 2004/0228320 A1 | 11/2004 | Laroia et al. | |
| 2004/0252229 A1* | 12/2004 | Jiang et al. | 348/385.1 |
| 2006/0281444 A1 | 12/2006 | Jung et al. | |
| 2007/0147539 A1* | 6/2007 | Gorokhov et al. | 375/295 |
| 2009/0150741 A1* | 6/2009 | Nebat | 714/751 |
| 2009/0150742 A1* | 6/2009 | Nebat | 714/751 |
| 2009/0150753 A1* | 6/2009 | Nebat et al. | 714/784 |
| 2012/0257687 A1* | 10/2012 | Gorokhov et al. | 375/295 |
| 2012/0297269 A1* | 11/2012 | Nebat et al. | 714/758 |

OTHER PUBLICATIONS

Peng, M., et al., "A Unified Architecture and Key Techniques for Interworking between WiMAX and Beyond 3G/4G Systems," Wireless Personal Communications, vol. 45, No. 1, total 24 pages. (Oct. 2, 2007).

ETSI EN 302 755 V1.1.1, "Digital Video Broadcasting (DVB); Frame structure channel coding and modulation for a second generation digital terrestrial television broadcasting system (DVB-T2)," ETSI, total 167 pages, (Sep. 2009).

Implementation guidelines for a second generation digital terrestrial television broadcasting system (DVB-T2) DVB Document A133, total 194 pages, (Feb. 2009).

ETSI, "Radio broadcasting systems; Digital Audio Broadcasting (DAB) to mobile, portable and fixed receivers," EBU/CENELEC/ETSI JTC, $2^{nd}$ Edition, total 226 pages, (May 1997).

3GPP TS 36.211 V9.0.0, "$3^{rd}$ Generation Partnership Project; Techinical Specification Group Radio Access Network; Evolved Universal Terrestrial Radio Access (E-UTRA); Physical Channels and Modulation (Release 9)," LTE, total 85 pages, (Dec. 2009).

Holma, H., et al., "LTE for UMTS," Wiley and Sons, $2^{nd}$ Edition, total 5 pages (2011).

Boronka, A., et al, "Removing Error Floor for Bit Interleaved Coded Modulation MIMO Transmission with Iterative Detection," IEEE, pp. 2392-2396, (May 4, 2005).

Ashikhmin, A., et al, "Extrinsic Information Transfer Functions: Model and Erasure Channel Properties," IEEE Transaction on Information Theory, vol. 50, No. 11, pp. 2657-2673, (Nov. 2004).

International Search Report Issued May 11, 2011 in PCT/EP10/068519 Filed Nov. 30, 2010.

U.S. Appl. No. 13/579,727, filed Sep. 17, 2012, Stadelmeier, et al.

Office Action issued on Apr. 16, 2013, in European Patent Application No. 10 782 630.7.

Combined Chinese Office Action and Search Report issued Dec. 26, 2013, in Chinese Patent Application No. 201080059117.7 with English translation.

* cited by examiner

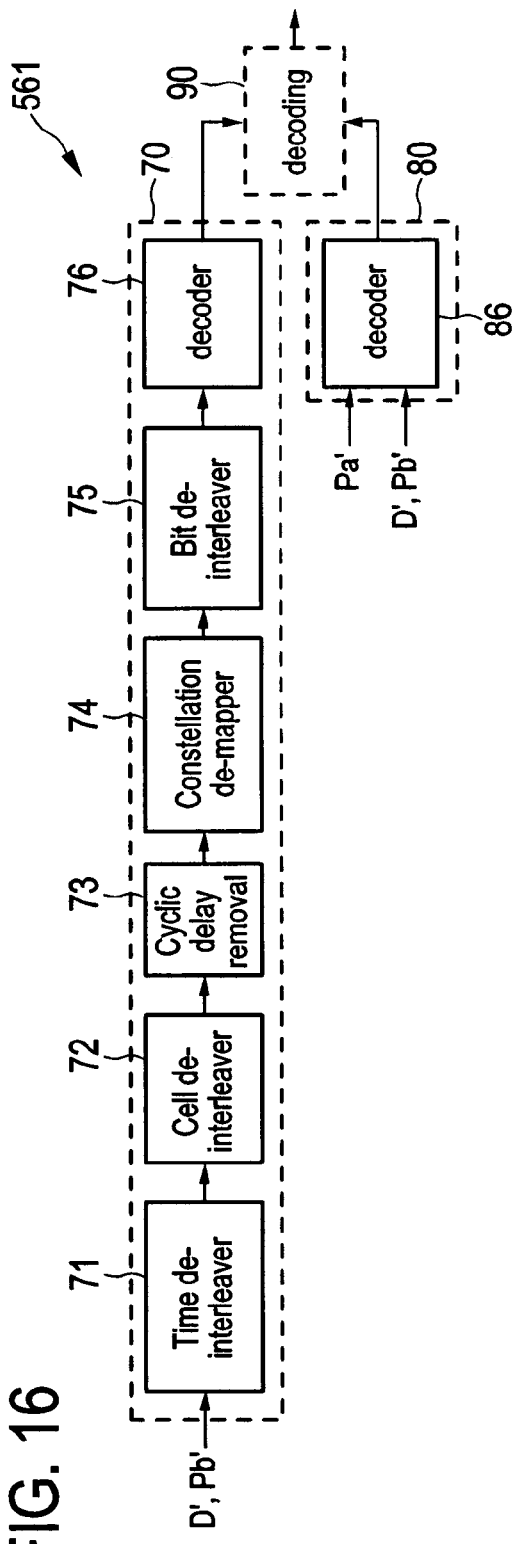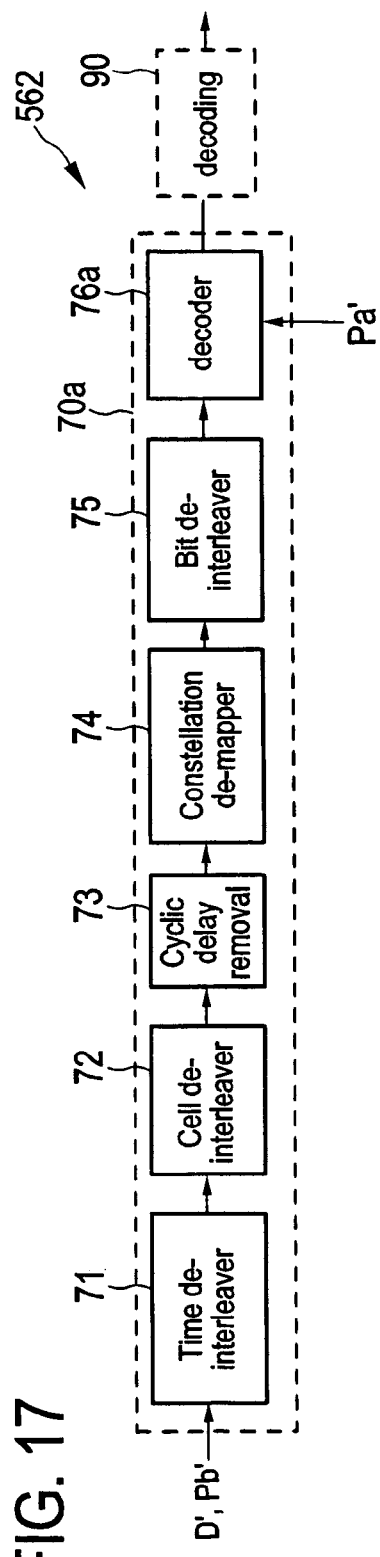
FIG. 16
FIG. 17

RECEIVER AND RECEIVING METHOD FOR RECEIVING DATA IN A BROADCAST SYSTEM USING INCREMENTAL REDUNDANCY RECEIVED THROUGH A UNICAST SYSTEM

CROSS-REFERENCE TO RELATED APPLICATION

The present application claims the benefit of the earlier filing date of European patent application 09 180 151.4 filed in the European Patent Office on Dec. 21, 2009 and is a national phase application of International patent application PCT/EP 2010/068519 filed on Nov. 30, 2010, the entire content of which applications is incorporated herein by reference.

BACKGROUND

1. Field of the Disclosure

The present disclosure relates to a receiver and a corresponding receiving method for receiving data in a broadcast system. The present disclosure relates further to a data transmission system and a corresponding data transmission method for transmitting and receiving data. Still further, the present disclosure relates to a computer program for implementing said receiving method on a computer.

The present disclosure relates, for instance, to the field of Digital Video Broadcasting (DVB) utilizing Orthogonal Frequency Division Multiplexing (OFDM). Further, the present disclosure can be applied in other systems, such as DAB (Digital Audio Broadcasting), DRM, MediaFlo, or ISDB system.

2. Description of Related Art

The transmission parameters of known broadcast systems, such as the broadcast systems in accordance with the DVB-T2 standard (second generation digital terrestrial television broadcast systems standard), are generally optimized for fixed reception with stationary receivers, e.g. with roof-top antennas. In future broadcast systems, such as the upcoming DVB-NGH (DVB Next Generation Handheld; in the following also referred to as NGH) standard, a mobile receiver (which is the main focus of this upcoming standard) shall be enabled to receive data correctly also in bad reception situations, e.g. despite suffering from multipath propagation, fading effects and Doppler shifts. Such broadcast systems are particularly characterized by the fact that there is generally no feedback channel and no signalling from receivers to transmitters.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present invention.

SUMMARY

It is an object to provide a receiver and a corresponding receiving method for receiving data in a broadcast system by which the probability of error-free reception/reconstruction of data by a mobile receiver is increased compared to receivers and receiving methods in known broadcast systems, even under bad reception conditions. It is a further object to provide a corresponding data transmission system and data transmission method as well as a corresponding computer program for implementing said receiving method.

According to an aspect there is provided a receiver for receiving data in a broadcast system, comprising:
a broadcast receiver unit for receiving from said broadcast system a receiver input data stream segmented into frames, wherein basic codeword portions of codewords are mapped onto said frames, a codeword comprising said at least a basic codeword portion generated from an input data word according to a first code,
a data demapper for demapping the basic codeword portions from said frames of the receiver input data stream,
a decoder for error correction code decoding said codewords into output data words of at least one output data stream in a regular decoding step by use of the basic codeword portion comprised in a codeword,
a check unit for checking if the regular decoding of a codeword is erroneous,
a unicast request unit for requesting, if said regular decoding of a codeword is erroneous, through a unicast system an auxiliary codeword portion of the erroneously decoded codeword for use as incremental redundancy in an additional decoding step,
a unicast receiver unit for receiving from said unicast system an auxiliary codeword portion of the erroneously decoded codeword,
wherein said decoder is adapted to decode the respective codeword again in an additional decoding step by additionally using the received auxiliary codeword portion, and
a data output for outputting said at least one receiver output data stream segmented into said decoded output data words.

According to a further aspect there is provided a data transmission system for transmitting and receiving data, comprising:
i) a broadcast transmitter for broadcasting data including:
  a data input for receiving at least one transmitter input data stream segmented into input data words,
  an encoder for error correction code encoding the input data words into codewords, a codeword comprising a basic codeword portion, wherein said encoder is adapted for generating said basic codeword portion from an input data word according to a first code, said basic codeword portion being provided for regular decoding,
  a data mapper for mapping the codewords onto frames of a transmitter output data stream, and
  a broadcasting unit for broadcasting said transmitter output data stream,
ii) a data storage for storing said input data words, said basic codeword portions and/or auxiliary codeword portions generated from an input data word according to a second code, said auxiliary codeword portion being provided as incremental redundancy if regular decoding of the codeword by use of the basic codeword portion is erroneous,
iii) a receiver according to the present invention, and
iv) a unicast transmitter for transmitting data in a unicast system comprising
  a unicast request input for receiving a unicast request from a unicast request unit requesting an auxiliary codeword portion,
  a retrieval unit for retrieving the auxiliary codeword portion from said data storage or from an auxiliary encoder adapted for error correction code encoding the corresponding input data word and/or basic codeword portion retrieved from said data storage into said auxiliary codeword portion, and
  a unicast transmitter unit for transmitting said auxiliary codeword portion to the requesting receiver.

According to still another aspect the present disclosure proposes a unicast transmitter for use in a data transmission system as defined above for transmitting and receiving data, said unicast transmitter including:

- a unicast request input for receiving a unicast request from a unicast request unit of a requesting receiver requesting an auxiliary codeword portion,
- a retrieval unit for retrieving the auxiliary codeword portion from a data storage or from an auxiliary encoder adapted for error correction code encoding the corresponding an input data word and/or basic codeword portion retrieved from said data storage into said auxiliary codeword portion, and
- a unicast transmitter unit for transmitting said auxiliary codeword portion to the requesting receiver.

According to further aspects there is provided a corresponding receiving method, data transmission method, a unicast transmission method, a computer program comprising program means for causing a computer to carry out the steps of decoding and checking of the receiving method as defined above, when said computer program is carried out on a computer as well as a non-transitory computer-readable recording medium that stores therein a computer program product, which, when executed by a processor, causes the steps of decoding and checking of the receiving method disclosed herein to be performed are provided.

Preferred embodiments are defined in the dependent claims. It shall be understood that the claimed apparatus, system, methods and computer program have similar and/or identical preferred embodiments as the claimed receiver and as defined in the dependent claims.

The present invention is based on the idea to enable a mobile receiver, for instance an in-car receiver or a handheld receiver (e.g. in a mobile phone or a PDA) in a broadcast system to decode broadcast data even under severe transmission channel conditions by improving the provided error correction measures. In particular, it is proposed to provide a sufficient amount of redundancy on request of the receiver to increase the robustness of the code. Said additional redundancy is provided by the data transmission system after a feedback from the receiver is received requesting additional redundancy. Said additional redundancy is, however, not broadcasted over the broadcast system, but is transmitted over a unicast system to the requesting receiver only. This receiver can use the additional redundancy to perform another decoding of previously (through the broadcast system) received codeword. Hence, if reception or reconstruction (decoding) of received broadcast data is erroneous or could only be made with insufficient quality, the receiver can repeat decoding using, in addition to the previously received codeword, the requested additional redundancy.

A receiver according to the present disclosure, e.g. in accordance with the upcoming DVB-NGH standard, can, for instance, be included in a mobile phone, which is also capable of receiving data from unicasting networks, like mobile communications systems, e.g. a 3G (UMTS) or 4G (LTE) communications system, as well as WLAN (wireless local area network), if access points are in nearby range. Additional redundancy for erroneously received or decoded codewords (the term "erroneously" being not only understood as meaning completely erroneously, but also "with insufficient quality") can be retrieved from a different architecture (vertical handover) according to the present disclosure, e.g. via the 3G, 4G or WLAN network.

Thus, generally it is not essential for the present invention in accordance with which particular unicast system the unicast request unit and the unicast receiving unit are implemented. Generally, any unicast system may be used, e.g. any (tele)communications system for wireless communication, and it is also possible that the receiver may be implemented to use several unicast systems for the proposed request and reception of additional redundancy, e.g. through the unicast system that is currently available in the respective situation. Further, the request and the reception of the additional redundancy can generally also be performed through different unicast systems, but preferably the same unicast system will be used. Since, generally, unicasting systems provide sufficient means for error correction and detection, it can be assumed that the transmission of the auxiliary codeword portion is error-free.

To ensure that a receiver (e.g. an existing legacy receiver), in particular its decoder, can correctly decode received data without any additional redundancy provided according to the present disclosure, a first code is applied by the error correction code encoder (generally applying forward error correction) of the broadcasting transmitter to generate a basic codeword portion for the data words of the data to be broadcast. This way of encoding can be the known standard way of encoding input data words into codewords, for instance the forward error correction (FEC) encoding as applied in DVB-T2 transmitters (e.g. LDPC encoding), i.e. the basic codeword portion may correspond to a ("normal" error correction code) codeword according to the DVB-T2 standard (in the following also referred to as T2). In addition, however, it is proposed according to the present disclosure to provide incremental redundancy for the decoder of the receiver by generating an auxiliary codeword portion from the input data words according to a second code. The "total" code, i.e. the code according to which the "total" codeword (comprising the basic codeword portion and the auxiliary codeword portion) is generated, thus has a lower code rate than the first code. Hence, said "total" code, in particular said auxiliary codeword portion, provides an even higher robustness and enables (better) decoding than the first code.

Generally, it is sufficient if the auxiliary codeword portion is only generated on the fly when a receiver requests it for a particular codeword. Hence, if it is not requested it is also not generated and/or stored, in particular in the data storage of the data transmission system, e.g. in a central server. To enable the generation of the auxiliary codeword portion if requested, however, at least the input data words are stored in the data storage. It is, however, also possible to store the basic codeword portion (in addition to the respective input data word) and/or the auxiliary codeword portion. For the practical implementation a trade-off can be made between the available storage space and the computing time for generating the auxiliary codeword portion on the fly. The data storage can be implemented as a buffer for buffering the respective data only for a particular period, in particular as long as there is a likelihood that a receiver might request a particular auxiliary codeword portion. Thus, after a certain time limit the stored data can be deleted from the data storage again.

Hence, under normal reception conditions the decoder does generally not (need to) request and use the auxiliary codeword portion at all, but only uses the basic codeword portion to decode the received data. In situations where the decoder realizes that the decoding of received data is erroneous or with insufficient quality it uses part of or the complete received auxiliary codeword portion to better decode the received data. Thus, the basic codeword portion can be used as it is by a receiver/decoder for decoding, and the auxiliary codeword portion is only requested and used if really needed for decoding.

Furthermore, the auxiliary codeword portion represents an additional measure for improving the decoding abilities, particularly for mobile receivers in case of bad reception conditions. The basic codeword portion is mapped into the transmitter output data stream by an appropriate data mapper of the transmitter, said transmitter output data stream (to which the receiver input data stream generally corresponds, apart from errors and disturbances introduced mainly by the transmission channel) generally being segmented into frames. For instance, a framing structure as applied according to the DVB-T2 system using T2 frames and FEF (Future Extension Frames) frames can be used for transporting the basic codeword portions in an appropriate way. The receiver comprises a corresponding demapper for demapping the basic codeword portions from the frames of the receiver input data stream.

As mentioned above, the data storage can be implemented as a central server that is able to communicate with the unicast transmitter and that is able to receive data from the broadcast transmitter. In an embodiment the data storage is arranged close to the broadcast transmitter or even part of the broadcast transmitter and securely receives the required data from the broadcast transmitter. In another embodiment, the data storage is part of the unicast system, e.g. a central server in a mobile communications system. In this case the data storage simply receives the broadcast data, just like all other broadcast receivers, and stores those data (or generates the auxiliary codeword portions therefrom and stores these auxiliary codeword portions). The unicast system (i.e. its operator) may then offer the provision of auxiliary codeword portions for retrieval by broadcast receivers as an extra service for its users (only).

Preferably, the encoder and the decoder apply a systematic code for generating said codewords such that said basic codeword portion comprises a data portion, in particular the input data word, and a basic parity portion, and said auxiliary codeword portions comprises an auxiliary parity portion. For instance, the basic codeword portion may be a combination of information symbols (e.g. information bits or information bytes) of an input data word and generated basic parity symbols (e.g. basic parity bits or bytes), said combination representing a basic codeword of a first code, which can be decoded by the decoder. In this example, the auxiliary codeword portion may comprise auxiliary parity symbols (e.g. auxiliary parity bits or bytes), said auxiliary codeword portion representing an auxiliary codeword of a second code, which can be used, to improve the likelihood of decoding said first codeword.

In a preferred embodiment the decoder comprises a first decoding unit for decoding, according to said first code, the input data word from a basic codeword including said basic codeword portion and a second decoding unit for decoding, according to said second code, the input data word from an auxiliary codeword including said basic codeword portion and said auxiliary codeword portion. Hence, according to this embodiment, an already existing decoder, i.e. the first decoding unit, can be used without any changes, and simply a second decoder, i.e. the second decoding unit, is added which is provided with the auxiliary codewords for decoding the input data words according to the second code, which itself may also have a lower code rate than the first code applied by the first decoding unit, but which can also have the same or a higher code rate.

In an embodiment the auxiliary codeword portions do not (or not only) contain auxiliary parities but also parts of or the complete input data word and/or basic parities of the basic codeword portion. For instance, the auxiliary codeword portion can be a repetition of the (partial or complete) input data word and (particularly in case of a repetition of only a partial input data word) the corresponding basic codeword portion, which is securely transmitted to the requesting receiver over the unicast system. According to an alternative embodiment the decoder comprises a single decoding unit for decoding, according to said second code, the input data word from a basic codeword including said basic codeword portion and for decoding, according to said second code, the input data word from an auxiliary codeword including said basic codeword portion and said auxiliary codeword portion. Hence, this embodiment requires less hard- and/or software compared to the embodiment described above.

According to a further embodiment the unicast request unit is adapted for stepwise requesting auxiliary codeword sub-portions for use as incremental redundancies if regular decoding of the codeword by use of the basic codeword portion and previously received auxiliary codeword sub-portions is erroneous. This embodiment provides the advantage that the receiver may decide how many additional incremental redundancies it requires for correct decoding if the regular decoding, i.e. the decoding by use of only the basic codeword portion, is erroneous. This is enabled by encoding the input data words such that two or more auxiliary codeword sub-portions (e.g. two or more groups of auxiliary parity symbols) are generated which can stepwise be used as such incremental redundancies, i.e. the auxiliary codeword sub-portions are generated such that not all sub-portions are required completely to perform a correct decoding of a received codeword, but one or more sub-portions thereof are also sufficient for a correct decoding. If more sub-portions are used, however, the code rate decreases and the probability of correct decoding increases.

Thus, each receiver may decide by itself (which decision may also change from time to time) how many additional incremental redundancies, i.e. how many of those at least two auxiliary codeword sub-portions, shall be used for increasing the quality of decoding, if needed. Hence, if only a small sub-portion is additionally required, the other auxiliary codeword sub-portions may be ignored and may not even be requested at all.

In a further embodiment said check unit is adapted for estimating the amount of incremental redundancy that is required for correct decoding of a codeword and said unicast request unit is adapted for requesting an auxiliary codeword portion providing at least said estimated incremental redundancy. Such an embodiment ensures that via the unicast system only the required amount of data is requested and transmitted, thereby reducing the waiting time of the receiver and the transmission load to a minimum.

In another embodiment the receiver further comprises a memory unit for storing the basic codeword portion or the decoding result of the regular decoding step of the basic codeword portion if the regular decoding of a codeword (and, if applicable, of previously received auxiliary codeword sub-portions) is erroneous, until the corresponding auxiliary codeword portion is received through said unicast system. Preferably, the decoding result is stored as soft information of the codeword to be decoded for later use in the additional decoding step together with the auxiliary codeword portion, which generally can be regarded as very reliable information due to the general reliability of information transmitted through a unicast system, particularly because of its error correction code encoding scheme and of its acknowledgement procedures that are generally applied according to which the correct receipt of a data package generally has to be acknowledged from a receiving instance to a transmitting instance in such unicast systems.

Preferably, the receiver further comprises a recombiner unit for recombining the received auxiliary codeword portion with the information stored in the memory unit and for providing the recombined information to the decoding unit. Said recombiner unit is preferably adapted for assigning an auxiliary reliability factor to said received auxiliary codeword portion that is set to a high (in particular maximum) value. Thus, the reliability of the auxiliary codeword portion is (in general) higher than the reliability of the respective basic codeword portion, and said decoder is adapted for taking said reliabilities into account in said additional decoding step.

To ensure that the unicast transmitter and the data storage know which information is requested, the unicast request unit is preferably adapted for including a codeword identification information into the request for an auxiliary codeword portion, said codeword identification information identifying the erroneously decoded codeword in the receiver input data stream. Generally, any kind of identification information that uniquely identifies the requested information can be used for this purpose. In a preferred embodiment said identification information is an address information that indicates the address of the erroneously decoded codeword. For instance, said unicast request unit is adapted for including a frame indicator, a data block indication, a synchronization information or a counter, in particular an ISSY field and a physical layer pipe (PLP) identifier of a receiver input data stream in accordance with a DVB broadcast system, as codeword address information into the request.

As an embodiment of such a codeword identification information it is also possible that the receiver includes in the request to the unicast transmitter the erroneously decoded codeword which is then used to correlate it with the codewords or codeword portions stored in the data storage for finding the right codeword or codeword portion which is then sent back to the receiver for use in the additional (improved) decoding step.

Still further, in an embodiment it is possible to use physical parameters of the broadcast data stream for said identification, provided these physical parameters are also stored in the data storage. For instance, in addition to the PLP identifier, the frame index (FRAME_IDX in the context of DVB-T2) of the codeword and cell address of the first cell of the codeword (according to §8.3.6.2 of the DVB-T2 standard) can identify the codeword.

Still further, in an embodiment it may be possible to create a separate identifier for identifying the codewords. For instance, a separate counter could be created and used to uniquely address the codewords within the data stream broadcast by the broadcast transmitter and the corresponding data (e.g. the auxiliary codeword portion) stored for a codeword in the data storage. Hence, the receiver—when requesting an auxiliary codeword portion from the data storage—could use this counter to uniquely indicate which auxiliary codeword portion it needs. This counter can then be used to select and retrieve the right auxiliary codeword portion (or the data for generating it) from the data storage.

Generally, the transmitter, for instance under control of the system operator of the broadcast system, has the freedom to apply the idea of providing incremental redundancies on request of the receiver only for selected transmitter input data streams but must not generally apply it to all transmitter input data streams. For instance, the system operator may decide to apply this idea for data streams that are provided for reception by both a stationary receiver and a mobile receiver, while for other data streams that shall generally only be received by stationary receivers no auxiliary codeword portions according to the present disclosure are generated and transmitted.

Preferably, the invention is applied for broadcasts of non-real-time data, i.e. of data that are generally not replayed by the receiver in real-time, but are buffered in the receiver until the user requests a replay at any later time ("Push Video on Demand"). In such an application the waiting time for obtaining and using any auxiliary codeword portions in case of decoding errors does not cause any inconvenience to the user.

Further, as mentioned above, if the data storage is part of the unicast system and is adapted for a highly reliable reception of the broadcast data from the broadcast transmitter, e.g., by a line of sight connection to the broadcast transmitter antenna, the service of incremental redundancy can be offered by the unicast system operator, thereby offering a kind of premium service for its users.

As mentioned above, one aspect of the present disclosure refers to a data transmission system. In the data storage the auxiliary codeword portions generated from an input data word according to a second code can be stored so that they can be transmitted to the receiver on request. In another embodiment, in the data storage the input data words are stored, which, if the corresponding auxiliary codeword portion is requested, must be encoded before transmission. Hence, in a preferred embodiment said system further comprises an auxiliary encoder adapted for error correction code encoding the input data word retrieved from said data storage into said auxiliary codeword portion.

It is to be understood that both the foregoing general description of the invention and the following detailed description are exemplary, but are not restrictive, of the invention.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 16 shows a schematic block diagram of a first embodiment of a decoder used in the receiver, FIG. 17 shows a schematic block diagram of a second embodiment of a decoder used in the receiver.

DESCRIPTION OF THE EMBODIMENTS

Figure 1:
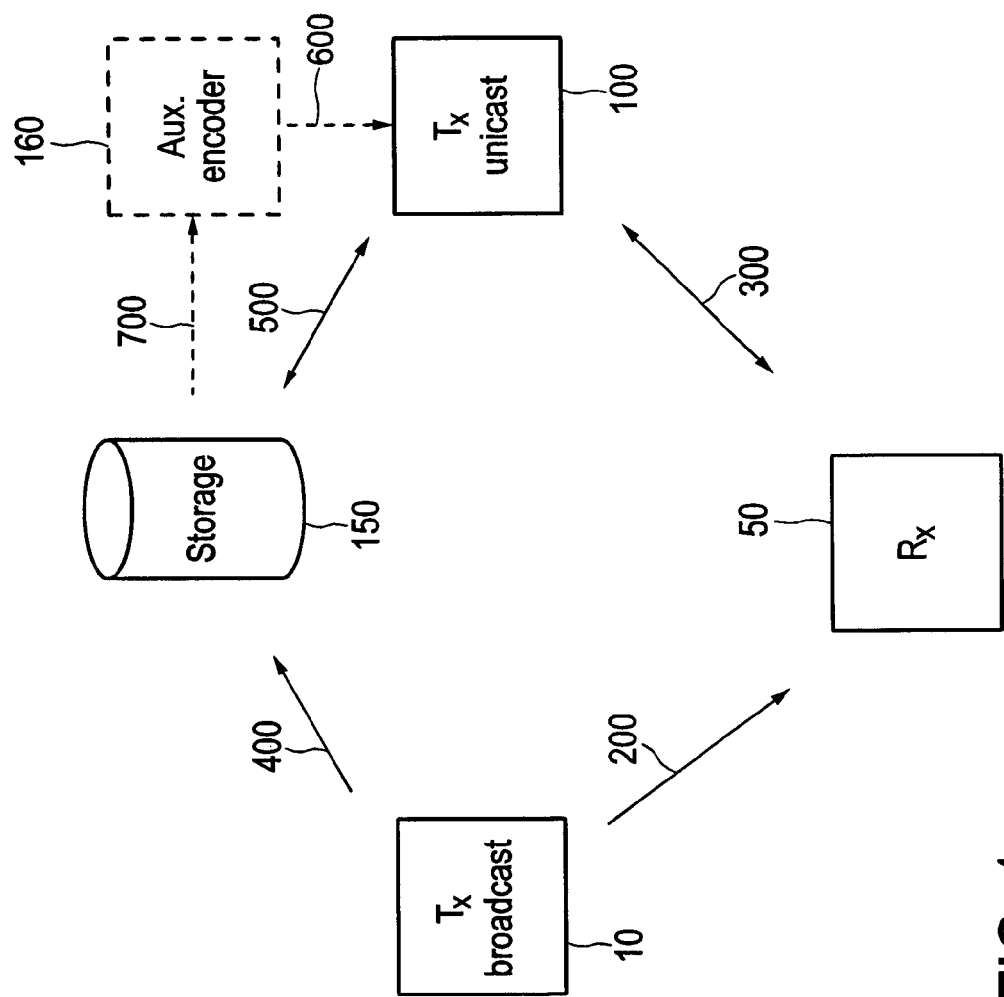
FIG. 1 shows a schematic block diagram of a data transmission system in accordance with the present disclosure.

Referring now to the drawings, wherein like reference numerals designate identical or corresponding parts throughout the several views, FIG. 1 shows a schematic block diagram of a data transmission system in accordance with the present disclosure. The system comprises a broadcast transmitter 10 for broadcasting data, a receiver 50 for receiving data broadcast by said broadcast transmitter 10, a unicast transmitter 100 for transmitting data in a unicast system, and a data storage 150 for storing data received from the broadcast transmitter 10. As will be explained in more details below, the receiver 50 is not only able to receive data broadcast by said broadcast transmitter 10, but is—to a certain extent—also able to communicate with the unicast transmitter 100 to have a bidirectional communication, and also the unicast transmitter 100 is able to have a bidirectional communication with the data storage 150. In particular embodiments, an additional auxiliary encoder 160 is further provided for encoding data before transmission to the unicast transmitter 100. In the following the various elements of the data transmission system will be explained separately to illustrate their functionalities and interrelations as proposed according to the present disclosure.

In this data transmission system the broadcast transmitter 10 and the receiver 50 as well the link 200 in between are part of a broadcast system, such as a video broadcast system in accordance with any DVB standard, particularly a wireless broadcast system. The unicast transmitter 100 and the receiver 50 as well as the link 300 in between are part of a unicast system, such as a communications system in accordance with any communications system standard, particularly a wireless communications system.

The link 400 between the broadcast transmitter 10 and the data storage 150 can be part of the broadcast system so that the data to be stored in the data storage 150 are obtained by the data storage 150 from the broadcast signal. Alternatively, this link 400 can also be established by a separate transmission channel, e.g. a wired or wireless transmission link, from the broadcast transmitter 10 to the data storage 150, which can, for instance, be a server arranged next to the broadcast transmitter 10.

The link 500 between the unicast transmitter 100 and the data storage 150 as well as the link 600 between the auxiliary encoder 160 and the unicast transmitter 100 can be part of the unicast system so that the unicast transmitter 100 communicates with the data storage 150 and the auxiliary encoder 160 via the same unicast system as is used for communicating with the receiver 50. The links 500, 600 and/or 700 between the data storage 150, the auxiliary encoder 160 and/or the unicast transmitter 100 can be established by any transmission means. Preferably, the auxiliary encoder 160 is arranged in close proximity to the data storage 150 so that a wired transmission line is the advantageous solution. The auxiliary encoder 160 might, however, also be part of the unicast system or even part of the unicast transmitter 100.

Figure 2:
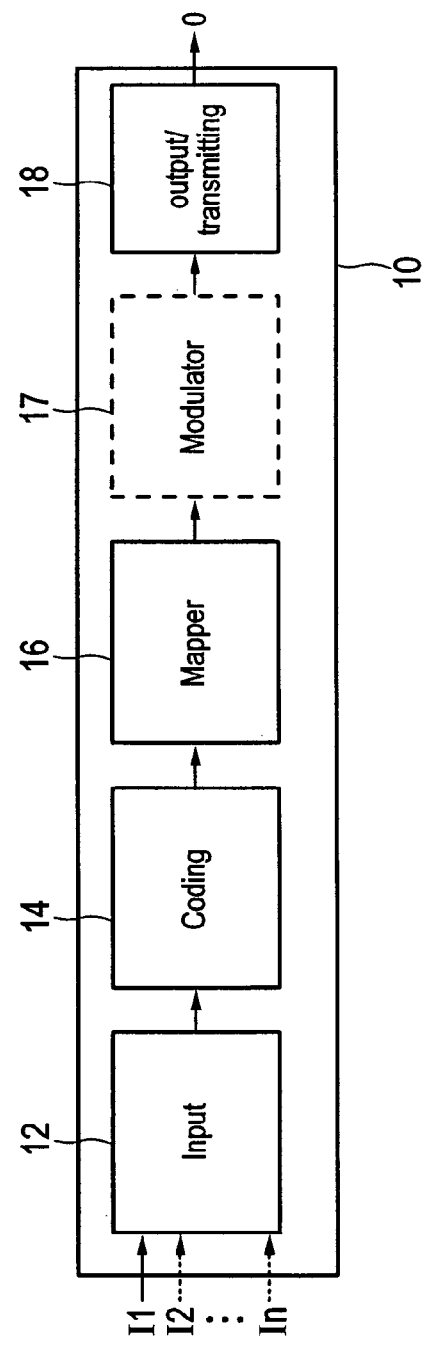
FIG. 2 shows a schematic block diagram of an embodiment of a broadcast transmitter used in such a data transmission system.

FIG. 2 shows an example block diagram of a broadcast transmitter 10 as used in the data transmission system shown in FIG. 1. Such a broadcast transmitter 10 can, for instance, be a Coded OFDM (COFDM) transmitter which may be used to transmit video, images and audio signals in accordance with the DVB-T2 (or an upcoming DVB-NGH) standard and in which the invention can be used. Said data to be transmitted by the broadcast transmitter 10 are generally provided as at least one transmitter input data stream I1, I2, . . . , In, which data streams are generally segmented into input data words. Said transmitter input data streams I1, I2, . . . , In may be one or more (e.g. MPEG-2) Transport Stream(s) and/or one or more Generic Stream(s), and the data may be carried therein in individual Physical Layer Pipes PLPs.

From the data input 12, in which some input processing may be performed on the transmitter input data streams I1, I2, . . . , In, such as CRC (Cyclic Redundancy Check) encoding, BB (BaseBand) header insertion, padding insertion and BB scrambling, the input data are provided to an encoder 14 in which the input data words of the transmitter input data streams I1, I2, . . . , In are encoded into codewords as will be explained in more detail below. From the encoder 14 the encoded data are then provided to a data mapper 16 for mapping the generated codewords onto frames of a transmitter output data stream O, which is then outputted by a transmitter unit 18. Generally (but not mandatorily), a modulator 17 is provided for modulating the data before output and transmission.

Figure 3:
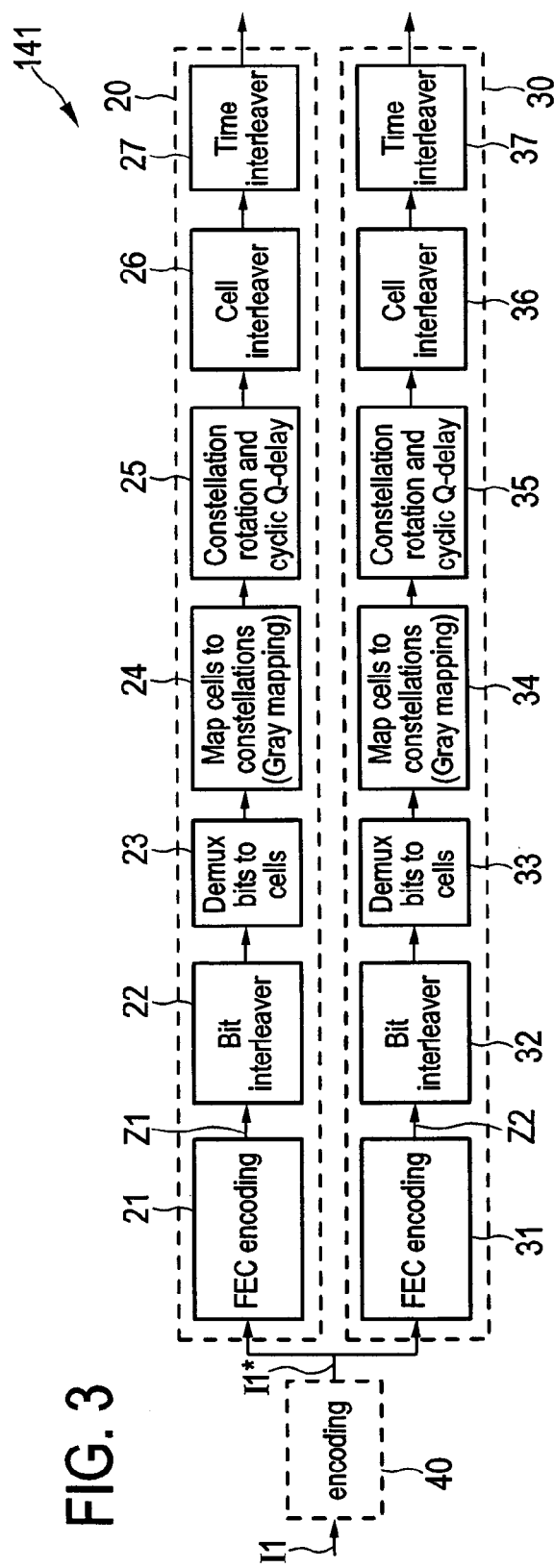
FIG. 3 shows a schematic block diagram of a first embodiment of an encoder used in the broadcast transmitter.

FIG. 3 depicts a first embodiment 141 of an encoder 14 of said broadcast transmitter 10. Said embodiment 141 of the encoder 14 comprises two branches, i.e. two encoding units 20, 30 to which a transmitter input data stream I1, called Physical Layer Pipe (PLP) in context of DVB, is fed. With the exception of the time interleavers 27, 37, the processing is preferably performed on a fixed frame level. An input frame of the transmitter input data stream I1, which shall be looked at in the following as an example, is denoted as a BBFrame in the context of DVB.

The first encoding unit 20, i.e. the upper branch, in this embodiment corresponds to the Bit Interleaved Coding and Modulation (BICM) chain as described in the DVB-T2 standard (ETSI EN 302 755 V1.1.1 (2009-09) "Digital Video Broadcasting (DVB); Framing structure Channel Coding and Modulation for a Second Generation Digital Terrestrial Television Broadcast system (DVB-T2)"). Hence, it comprises an FEC encoding block 21 for subsequent LDPC encoding, a bit interleaver 22, a demultiplexer 23 for demultiplexing bits to cells, a constellation mapper 24 for mapping cells to constellations according to Gray mapping, a unit 25 for constellation rotation and cyclic Q-delay, a cell interleaver 26 and a time interleaver 27. The function and operation of these units 21 to 27 is generally known and, for instance, described in the DVB-T2 standard, which is herein incorporated by reference, so that no further explanations are provided here.

The second encoding unit 30, i.e. the lower branch, is also provided with the transmitter input data stream I1 in this embodiment. The FEC encoding block 31 is generally not identical to the FEC encoding block 21 of the first encoding unit 20. While said FEC encoding block 21 appends to the input data words parity bits of an LDPC codeword, said LDPC parity bits being generally referred to herein as basic parity portion of a first code, the FEC encoding block 31 generates additional redundancy to increase the robustness of the overall channel code, said overall channel code referring to the redundancy from both FEC encoding blocks 21 and FEC encoding blocks 31. In other words, the FEC encoding block 31 generates auxiliary parity bits that can, in addition to the basic parity bits, be used by a receiver 50 to decode a received codeword as will be explained in more detail below.

The consecutive blocks 32 to 37 can generally be identical to the blocks 22 to 27 and can thus be adopted from the DVB-T2 standard, but can also be adjusted according to the specific circumstances and needs of the second encoding unit 30. The application of a time interleaver 37 is optional since applying time interleaving within just one frame of auxiliary parity bits is already covered within the cell interleaver 36. However, applying time interleaving over more than one auxiliary parity data frame allows for more time diversity.

In this embodiment, the input of the two FEC encoding blocks 21, 31 is identical, in particular an input data stream I1*, which substantially corresponds to the transmitter input data stream, but wherein to the input data words (BBFrames in the context of DVB) parity bits of a BCH codeword have been added by a BCH encoder 40 (as is generally known in the art of DVB). Hence, the input data stream I1 has already been encoded by a BCH code, before further encoding is performed in the FEC encoders 21 and 31. It should, however, be noted that the encoder 40 is generally not an essential element of the present invention. In certain applications the encoder 40 can be completely omitted, can be replaced by a different encoder or this initial encoding can be part of the encoding performed in the encoders 21 and 31.

Further, it shall be noted that hereinafter it is generally referred to parity "bits" and input data "bits". The same idea is, however, also applicable using parity "bytes" and input data "bytes" or, generally, parity "symbols" and input data "symbols".

The output of the first encoding unit 20 is fed forward to a data mapper 16, generally including a frame builder, and, optionally, an OFDM generator. The data mapper 16 and the OFDM generator may generally operate according to the DVB-T2 standard which particularly shows embodiments of these blocks. For mapping the output of the first encoding unit 20, however, various embodiments exist which will also be explained below in more detail.

Figure 4A:
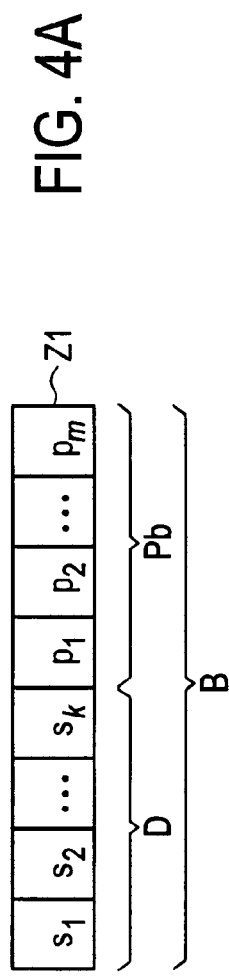
FIG. 4 shows the generation of a data portion, a basic parity portion and an auxiliary parity portion according to the present disclosure.

By way of FIG. 4 the encoding performed in the FEC encoding blocks 21 and 31 shall be explained in more detail. FIG. 4A shows a first codeword Z1 which is the output of the FEC encoding block 21. Said first codeword Z1 comprises a data portion D, which generally corresponds to the input data word of the FEC encoding block 21 and which, according to this embodiment, comprises k input data bits $s_1, s_2, \ldots, s_k$, and a basic parity portion Pb comprising, in this embodiment, m parity bits $p_1, p_2, \ldots, p_m$. This first codeword Z1 generally corresponds, in the context of DVB-T2, to the LDPC codeword belonging to a code $C_1$ with code rate $R_1=k/(k+m)$, where k is the amount of the systematic bits (input data bits) s and m is the amount of the basic parity bits p. By use of these codewords a receiver 50, in particular a stationary receiver and/or a mobile receiver that is not affected by too many disturbances, is able to decode the input data encoded therein.

Figure 4B:
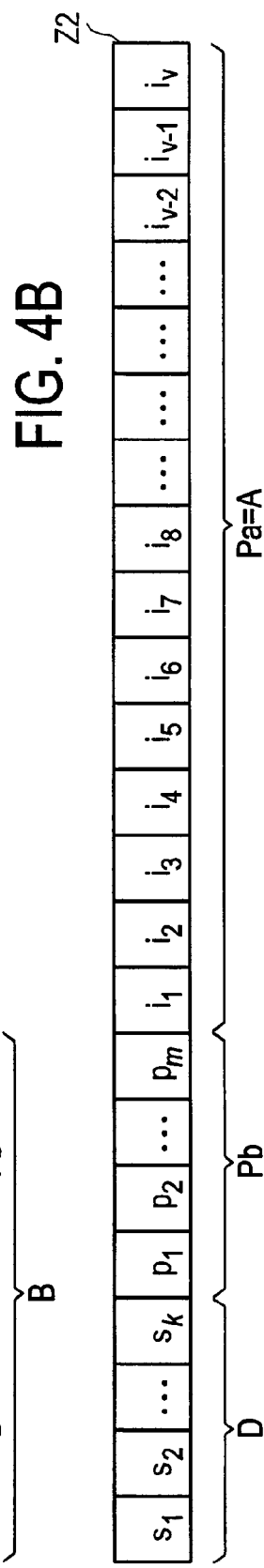

The second codeword Z2 shown in FIG. 4B belongs to a second code $C_2$ of a lower code rate $R_2=k/(k+m+v)<R_1$. Said second codeword Z2 comprises, in addition to the data portion D and the basic parity portion Pb, an auxiliary parity portion Pa of v auxiliary parity bits $i_1, i_2, \ldots, i_v$. Said auxiliary parity portion Pa may be used by a receiver 50, for instance in case of transmissions errors, decoding errors and/or an insufficient quality of the decoding, as incremental redundancy in addition to the codeword Z1 for decoding. Hence, if the first codeword Z1 cannot be decoded correctly at the receiver 50, some or all of the auxiliary parity bits $i_1, i_2, \ldots, i_v$ may be used for decoding, in addition to the first codeword Z1, to increase the probability of correct and error-free (or at least an increased quality of) decoding. For this purpose the (partial or complete) auxiliary parity portion Pa can be additionally requested and used by the receiver 50 as will be explained below in more detail.

Hence, the combination of the codeword Z1 and the auxiliary parity portion Pa (of the second codeword Z2) can also be regarded as a "total" codeword of a "total" code having a lower code rate than the first code of the codeword Z1, i.e. the codeword Z1 can be regarded as a basic codeword portion B of this "total" codeword and the auxiliary parity portion Pa can be regarded as an auxiliary parity portion A of this "total" codeword. Here in this embodiment shown in FIG. 4 this "total" codeword is identical to the codeword Z2. This does, however, not hold for all embodiments as will be shown below.

Figure 5:
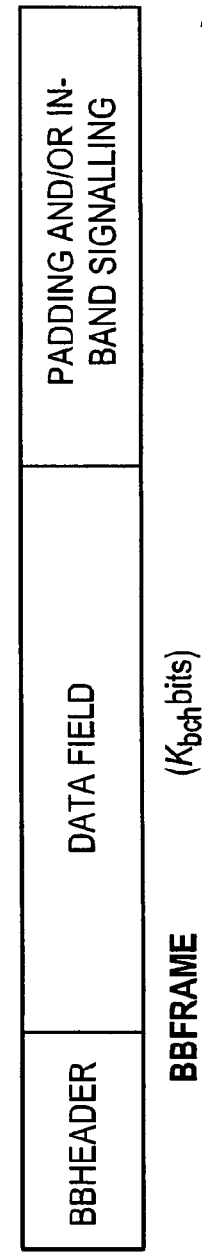
FIG. 5 shows the format of a BBFrame according to the DVB-T2 standard.
Figure 6:
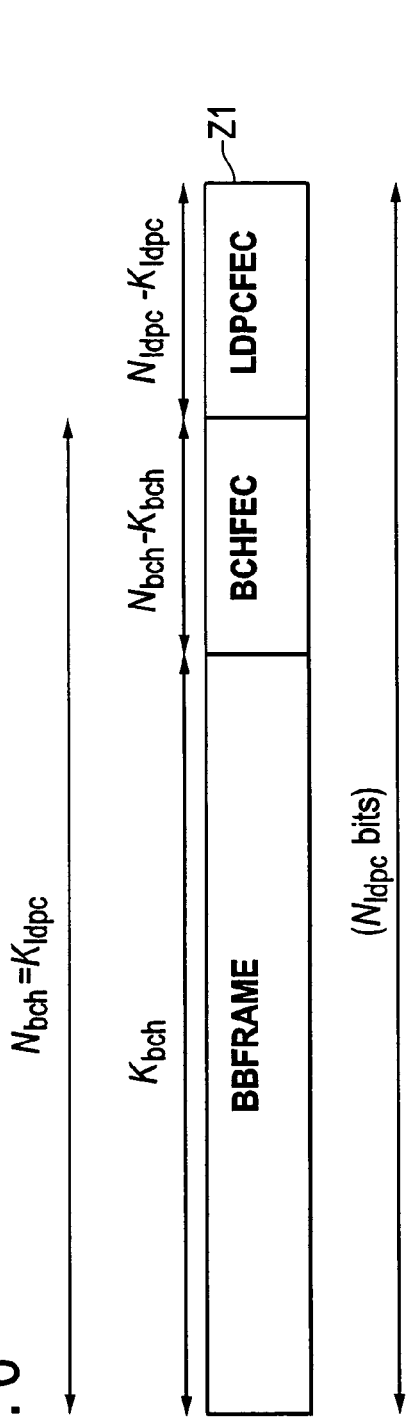
FIG. 6 shows the format of an FEC codeword in accordance with a DVB-T2 standard.

In the context of DVB-T2 the transmitter input data stream to the encoder 14 is generally segmented into frames referred to as BBFrames comprising $K_{bch}$ bits as exemplarily depicted in FIG. 5. A first codeword Z1 (in this context) generated therefrom by the BCH encoder 40 and the first encoding block 21, i.e. in accordance with the encoding as performed according to the DVB-T2 standard, is schematically depicted in FIG. 6. This codeword is a standard FEC codeword comprising the (systematic) input data portion, which itself consists of $K_{bch}$ bits, followed by $N_{bch}-K_{bch}$ parity bits of the BCH encoder, followed by $N_{ldpc}-K_{ldpc}$ parity bits of the LDPC encoder. In total, this codeword comprises $N_{ldpc}$ bits. Hence, the basic LDPC code has a code rate of $R_c=K_{ldpc}/N_{ldpc}$. Referring to the above explanations provided with reference to FIGS. 4 and 5 $K_{ldpc}$ corresponds to k (i.e. the portions BBFRAME and BCHFEC are regarded as the input data word D) and $N_{ldpc}$ corresponds to k+m (i.e. the portion LDPCFEC is regarded as the basic parity portion Pb).

The second encoding block 31 computes auxiliary parity bits for use as incremental redundancy, based on its input, which generally is the same as the input of the FEC encoding block 21. In general, these are v auxiliary parity bits which can be partitioned into q sub-portions. The k-th sub-portion is of length $v^{(k)}$. Thus, it holds $$\sum_{k=1}^{q} v^{(k)} = v.$$

If the bits from the first x sub-portions are then appended to the first basic codeword (Z1) generated by the first encoding unit 20 and received (on request) and evaluated by a receiver 50, an auxiliary codeword (Z3*) of the "total" code is generated which stems from an encoder with the overall code rate $R_c^*$ of $$R_c^* = \frac{k}{k + \sum_{k=1}^{x} v^{(k)}} < R_c$$

which is smaller than $R_c$, which means that this overall code is more powerful.

Figure 7:
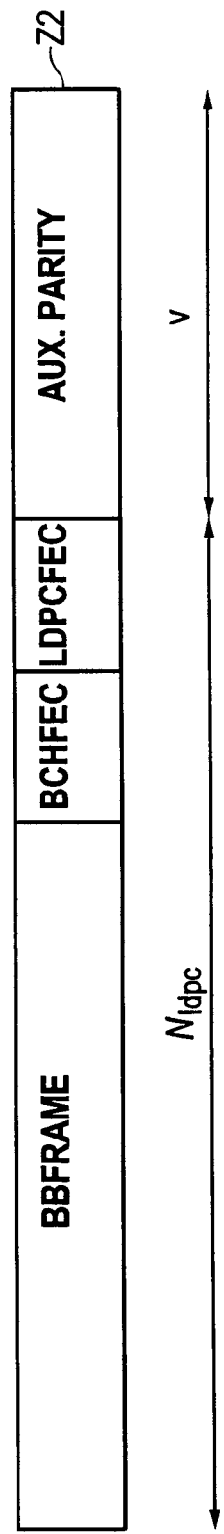
FIG. 7 shows the format of a codeword in accordance with the present disclosure.

FIG. 7 shows such an embodiment of a codeword Z2 (in the context of DVT-T2) generated by the second FEC encoding block 31 which, according to this embodiment, also comprises BCH and LDPC encoding, but additionally generates v auxiliary parity bits for use as incremental redundancy at the receiver 50 in case of need.

Figure 8:
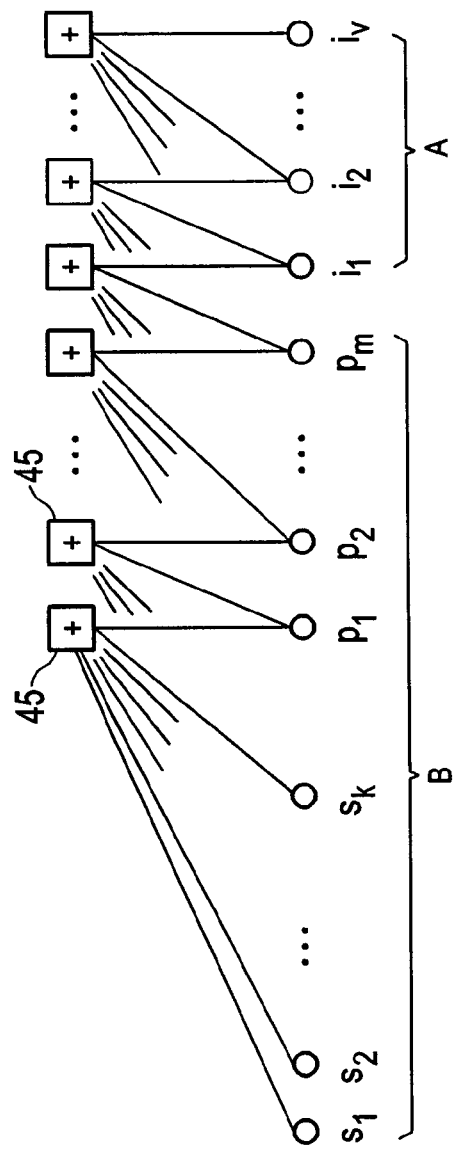
FIG. 8 shows a diagram illustrating the generation of the bits of a codeword according to the present disclosure.

The generation of additional LDPC parity bits, e.g. of a known LDPC code, and their use as incremental redundancy is generally known, e.g. from Kim J. et al., "Design of Rate-Compatible Irregular LDPC Codes for Incremental Redundancy Hybrid ARQ Systems", ISIT 2006, Seattle, USA, Jul. 9-14, 2006. A diagram illustrating such an "extended" code and its generation is shown in FIG. 8. Therein, it is shown how each of the bits of the basic codeword portion B and of the auxiliary parity portion A are generated from other, in particular all "previous" bits in the codeword by use of modulo-2 units 45. This way of generating the codeword ensures that a decoder can decode a codeword by use of only the basic codeword portion B or by additional use of one or more of the auxiliary parity bits of the auxiliary parity portion A.

Next, an embodiment of the data mapper 16 shall be explained. The data mapper 16 maps the first codeword (generally, the basic codeword portion B) generated by the first encoding unit 20 in any way onto the frames of the transmitter output data stream O. In other words, using the terminology from FIG. 3, for each input data word the corresponding data portion D and the basic parity portion Pb are mapped onto the transmitter output data stream O. A particular embodiment for such a mapping structure shall be illustrated with reference to FIGS. 9 and 10. Other mapping structure can, of course, also be used, e.g. any newly defined or arbitrary mapping structure.

Figure 9:
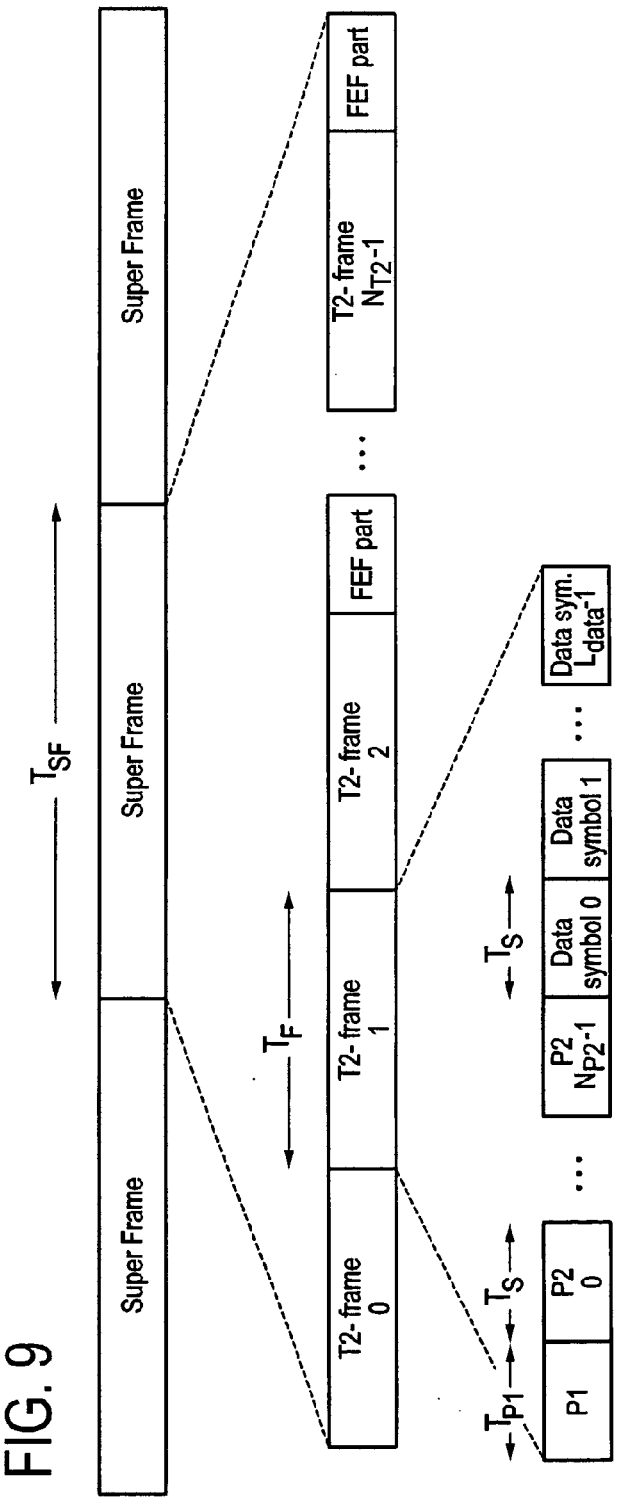
FIG. 9 shows a diagram illustrating the DVB-T2 framing structure.

FIG. 9 illustrates the framing structure as applied according to the DVB-T2 standard. In particular, according to DVB-T2, a superframe structure is applied where each superframe is subdivided into a multitude of T2 frames. After each predetermined number of consecutive T2 frames an FEF part (Future Extension Frame part) is inserted for future use. This is also schematically illustrated in the data stream structure shown in FIG. 10. When applying such a framing structure in the transmitter 10, the data mapper 16 is adapted in one embodiment such that the data portion and the basic parity portion of a codeword, which can also be regarded as the basic codeword portion B and, in this embodiment, the basic codeword Z1 (see FIG. 4A), are mapped onto the T2 frames. Such a mapping provides the advantage that a conventional receiver in accordance with the DVB-T2 standard evaluates the data transmitted in the T2 frames as usual. Also mobile receivers, for instance in accordance with the upcoming DVB-NGH standard (which may—additionally or only—make use of the data stored in the FEF parts), whose decoding capability may often be affected by disturbances, may also access the T2 frames and decode, in a first step, the codewords embedded therein. In addition, however, particularly in case of disturbances and decoding errors resulting therefrom, such mobile receivers may request additional redundancies (particularly auxiliary parity data) and use parts or all of the auxiliary parity data for decoding, in a second step, the codeword received in the corresponding T2 frame again, as will be explained in more detail below. Preferably, the invention is applied for broadcast of non-real-time data, which are buffered in the receiver for later use.

According to another embodiment of the data mapper 16 all data required for decoding by a mobile receiver are transmitted in the FEF parts, i.e. a basic codeword comprising the data portion D and the basic parity portion Pb is mapped onto the FEF part. Such mobile receivers thus ignore the data contained in the T2 frames which are only accessed by stationary receivers, in particular receivers in accordance with the DVB-T2 standard.

Figure 10:
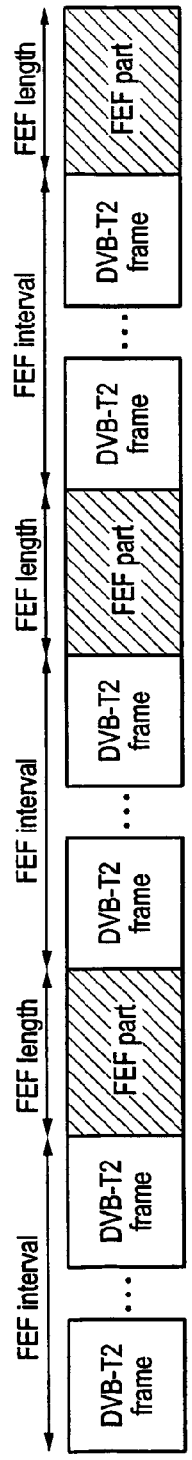
FIG. 10 shows a diagram illustrating the arrangement of T2 frames and FEF frames within a superframe in accordance with the DVB-T2 standard.

Of course, there may be further embodiments of the data mapper 16. The framing structure applied by the transmitter 10 may also be completely different than the framing structure used according to the DVB-T2 standard as shown in FIGS. 9 and 10. Generally, any framing structure, e.g. a newly created framing structure, may be applied as long as the receiver is able to detect or know in advance where to find the data portions and the basic parity portions. Further, in embodiments BCH and LDPC encoding is not required, but other codes (i.e. other FEC codes) can be applied.

With the embodiment 141 of the encoder 14 shown in FIG. 3, i.e. having two encoding units 20, 30, it is preferred that the output of the second encoding unit 30, i.e. either the complete codeword Z2 or only the auxiliary codeword portion A thereof, is stored in the data storage 150 for later use if requested by the receiver 50. As, according to this embodiment 141 of the encoder 14, the codeword Z2 is also further processed in the encoding unit 30 like the codeword Z1 (in the encoding unit 20) it can be transmitted to the data storage 150 (or to multiple data storages 150) by a broadcast. For instance, a separate transport stream can be generated and broadcast only for reception by those data storages 150. Since the data storage(s) 150 is (are) generally stationary, the broadcast data are generally received there safely and are not (much) disturbed, as compared to reception by moving receivers, so that these data can be considered to have a high reliability.

Figure 11:
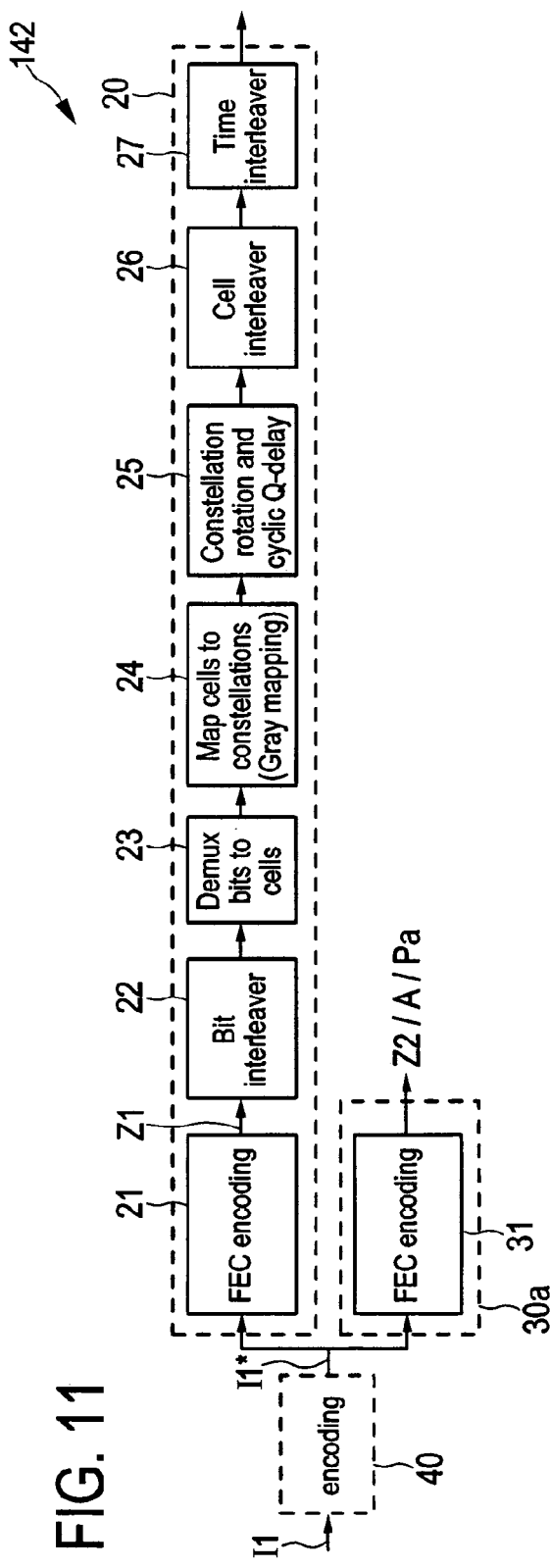
FIG. 11 shows a schematic block diagram of a second embodiment of an encoder used in the broadcast transmitter.

In an alternative embodiment 142 as depicted in FIG. 11 the encoding unit 30a only comprises the FEC encoder 31 for generation of the codeword Z2 (or only of the auxiliary codeword portion A or of the auxiliary parity portion Pa, respectively). In this case the output data of the encoding unit 30a is not transferred to the data storage 150 by a broadcast, but is transferred via a different channel, e.g. through a wired line connecting the broadcast transmitter 10 and the data storage(s) 150. Also in this case the data received by the data storage(s) 150 can be considered to be highly reliable.

Figure 12:
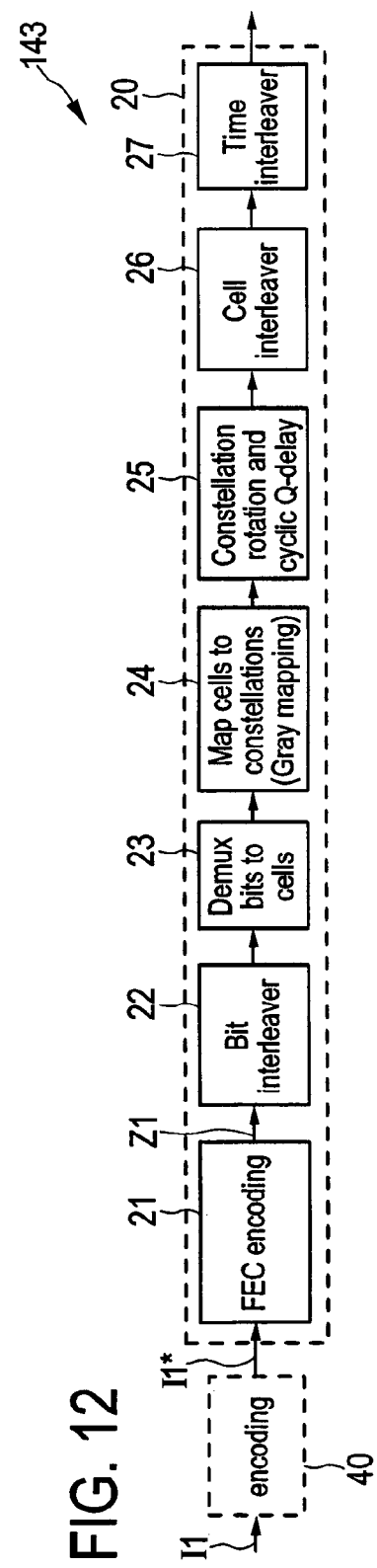
FIG. 12 shows a schematic block diagram of a third embodiment of an encoder used in the broadcast transmitter.

In a further embodiment 143 of the encoder 14 as depicted in FIG. 12 only a single encoding unit 20 is provided for generation of the basic codeword portion B only, i.e. comprising only a data portion D and a basic parity portion Pb. In this case, the auxiliary codeword portion A is not generated by the broadcast transmitter 10, in particular its encoder 14, but generally the data portion D and/or the basic codeword portion B is stored in the data storage 150. Hence, if an auxiliary codeword portion A is later requested by the receiver 50, this auxiliary codeword portion A must be generated on the fly from the stored data portion D or the stored basic codeword portion B as will be explained below. Here, using stored basic codeword portions B is preferred for this generation of auxiliary codeword portions on the fly, since often this requires less time if these portions are accumulated to obtain a "total" codeword, as is often the case (see §6.1.2.1 of the DVB-T2 standard).

With this embodiment it is preferred that the data storage 150 includes a (stationary) broadcast receiver for receiving the broadcast data, i.e. the same data that are received by all other broadcast receivers, like the receiver 50 shown in FIG. 1. Since the receiver of the data storage is stationary, the data can be reliably received. The data storage 150 then has various options for storing the data:

A first option is to store the received data in the data storage 150 just as they have been received, i.e. without further processing. Depending on the respective embodiment, the received data may be the input data word D, the basic codeword portion B and/or the auxiliary codeword portion A. If later an auxiliary codeword portion A is requested, it is either generated on the fly from the stored input data word D and/or the stored basic codeword portion B by encoding, e.g. by use of the auxiliary encoder 160, or it is retrieved from the data storage 150 if already stored therein and forwarded to the requesting receiver through the unicast system.

A second option is to first decode the received data, i.e. to retrieve the input data word D, and then store only the input data word D. Again, if later the corresponding auxiliary codeword portion A is requested, it is generated on the fly from the stored input data word D by encoding, e.g. by use of the auxiliary encoder 160. Alternatively, the decoded input data word D could be encoded to generate the basic codeword portion B and/or the auxiliary codeword portion A, which could then be stored in the data storage 150.

A third option is to directly encode the received data to generate the auxiliary data portion A and store said auxiliary data portion A in the data storage B, e.g. by use of the auxiliary encoder 160. This saves time since later, when the auxiliary data portion A is requested by a receiver 50, no encoding step is necessary for encoding on the fly, but the readily available auxiliary data portion A can be provided directly. However, this option requires more storage space in the data storage 150.

In still a further embodiment the single encoding unit 20 may further be adapted to generate a complete codeword Z2 as shown in FIG. 4B. Nevertheless, only the basic codeword portion B is then transmitted by the broadcast transmitter 10 while the auxiliary codeword portion A is split off, transferred to the data storage 150 and stored therein.

As shown in FIG. 1 the data input 12 may be adapted for not only receiving a single transmitter input data stream, but may generally receive a number n of transmitter input data streams, for instance a number n of physical layer pipes. The encoder 14 may, in such a case, however be adapted to select if a transmitter input data stream is encoded as usual, i.e. according to the basic code and without the generation of any auxiliary parity data, or if another code having a lower code rate shall be applied and auxiliary parity data for use as incremental redundancies by the receiver on its request shall be generated. It may also be possible that various codes with different (e.g. decreasing) code rates may be available for application by the encoder so that even more than two possibilities exist. Which code and which code rate to apply may be prescribed, e.g. by the operator of the transmitter or the owner of the broadcast channel. But the choice of the code may also depend on the kind of data to be transmitted. For instance, audio data may be encoded with a code having a higher code rate than video data so that only for video data such auxiliary parity data are generated or vice versa. As another example, any decoding errors may be acceptable when watching news, but may not be acceptable when watching a movie for which the option of generating and transmitting auxiliary parity data may thus be provided.

Figure 13:
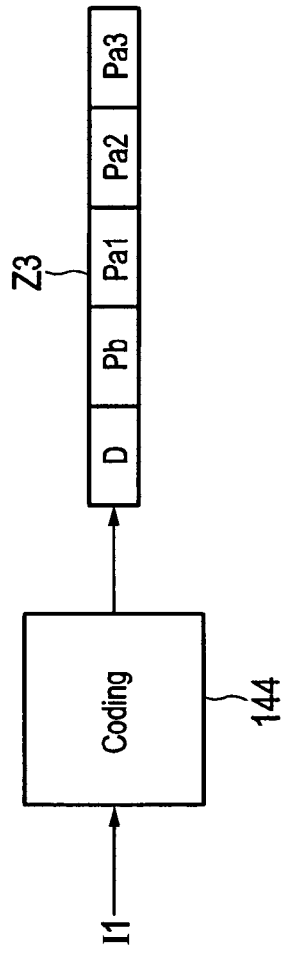
FIG. 13 shows a schematic block diagram of a fourth embodiment of an encoder used in the broadcast transmitter.

A still further embodiment 144 of an encoder 14 is illustrated in FIG. 13. Said encoder 144 is adapted such that it generates two or more auxiliary parity sub-portions Pa1, Pa2, Pa3 in addition to the data portion D and the basic parity portion Pb thus forming a codeword Z3. Hence, comparing the codewords Z2 and Z3, the auxiliary parity sub-portions Pa1, Pa2, Pa3 of the codeword Z3 can be seen as segments of the auxiliary parity portion Pa of the codeword Z2, having in total the identical content, although generally the auxiliary parity sub-portions Pa2 and Pa3 can also be additional auxiliary parity portions in addition to the auxiliary parity portion Pa1 that (alone) corresponds to the auxiliary parity portion Pa. It shall, however, be noted that the other embodiments 141, 142, 143 of the encoder 14 shown in FIGS. 3, 11, 12 are generally also able to generate two or more auxiliary parity sub-portions Pa1, Pa2, Pa3 (rather than a single auxiliary parity portion Pa) in addition to the data portion D and the basic parity portion Pb.

These auxiliary parity sub-portions Pa1, Pa2, Pa3 are generated such that they can be stepwise used by a decoder as incremental redundancies. In other words, generally it is possible to decode the codeword by use of only the data portion D and the basic parity portion Pb (i.e. the basic codeword portion). If such decoding fails, the first auxiliary parity sub-portion Pa1 (i.e. a part of the auxiliary codeword portion) may be requested and used in addition for decoding. If this again fails (or provides insufficient quality) the second auxiliary parity sub-portion Pa2 may be added and so on.

All the auxiliary parity sub-portions Pa1, Pa2, Pa3 may be stored in the data storage 150. However, it is also possible and advantageous to store only the data portion D (or the basic codeword portion B) in the data storage 150 and to stepwise generate and transmit the auxiliary parity sub-portions Pa1, Pa2, Pa3 on request of the receiver 50.

Figure 14:
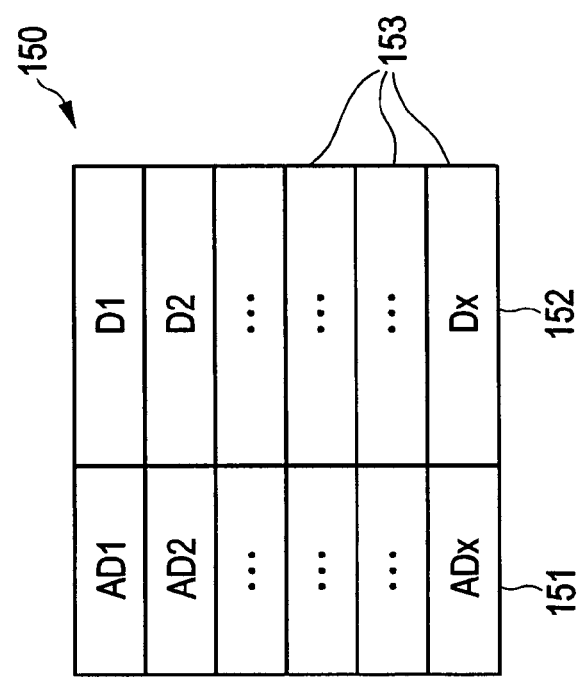
FIG. 14 shows a schematic diagram of a data storage as used in the data transmission system shown in FIG. 1.

FIG. 14 shows an embodiment of the data storage 150 according to the present disclosure. In this embodiment the data storage 150 is implemented as a kind of look-up table (or buffer) having a number x of separately addressable buffer units 153, each buffer unit 153 comprising an address field 151 and a data field 152. In the address field 151, e.g. the address field AD1, an address information is stored by which the data, e.g. the input data word D1, stored in the assigned data field 152 is uniquely identified, i.e. which enables the unicast transmitter 100 to retrieve from the data storage 150 the correct data as requested by the receiver 50.

The data storage 150 can be implemented as a kind of FIFO (first in first out) buffer since the data need only be stored for some time. If it is expected that no request will be issued from a receiver to obtain a particular auxiliary codeword portion (since, for instance, the time of broadcasting the original data is already long over or these have meanwhile become "invalid", updated or are no longer up-to-date, e.g. a news broadcast for which already a later news broadcast has been broadcast), then the corresponding data stored in the data storage 150 can be deleted. Thus, generally a time limit is decisive for deletion or continued storage of particular data in the data storage 150.

Further, in an embodiment, if the data stored in the data storage have been requested by one or more receivers for transmission through the unicast system, this could be an indication that decoding errors appeared and that there were transmission errors in the broadcast, so that the corresponding auxiliary codeword portions stored in the data storage should be kept there and not be deleted, since there might be a likelihood that further receivers might request them later. Generally, however, only a certain amount of buffer units need to be provided in the data storage 150.

If, as shown in FIG. 14, input data words D (and/or basic codeword portions B) are stored in the data storage 150 a separate auxiliary encoder 160 (see FIG. 1) is additionally provided in the data transmission system for generating the requested auxiliary codeword portion A from the respective input data word D stored in the data storage 150. In an alternative embodiment, however, instead of the input data words D, a duplication of the codeword broadcast by the broadcast transmitter 10 or the auxiliary codeword portion A (see e.g. FIG. 4B) can be stored in the data storage 150 so that—in the latter case—no additional auxiliary encoder 160 is required in the data transmission system, reducing the amount of computations to be performed in the auxiliary encoder 160 at the cost of a larger storage space in the data storage 150.

Figure 15:
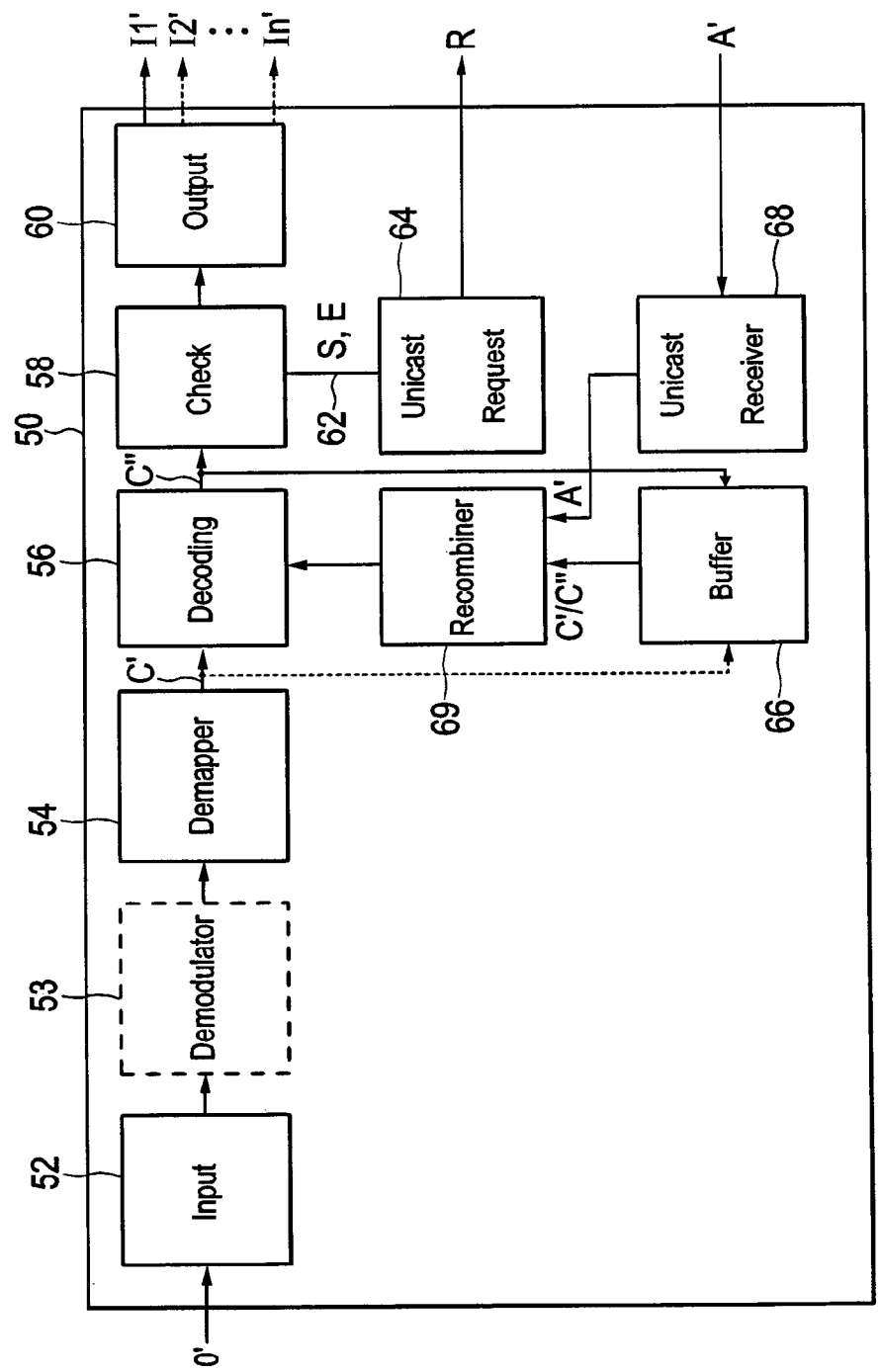
FIG. 15 shows a schematic block diagram of a receiver in accordance with the present disclosure.

FIG. 15 shows a schematic block diagram of a receiver 50 in accordance with the present disclosure for use in a data transmission system as illustrated in FIG. 1. The receiver 50 is particularly adapted for requesting an auxiliary parity portion (generally, the auxiliary codeword portion) as incremental redundancy in case of erroneous or low quality decoding.

The receiver 50 comprises a data input 52 for receiving a receiver input data stream O' which generally corresponds to a transmitter output data stream O that has been transmitted over a broadcast channel of the broadcast system by a transmitter 10 and which may thus be affected by disturbances that may appear in such a broadcast system, particularly in case of using mobile receivers which are the main application of the present invention on the receiver side.

Optionally, a demodulator 53 is provided that is interrelated with the (optional) modulator 17 of the transmitter 10 for demodulating the received receiver data input stream O'. A demapper 54 demaps the (optionally demodulated) receiver data input stream O', particularly at least the data portions and the basic parity portions (i.e. the basic codeword portions) of the codewords mapped into the receiver data input stream O' as will be explained below in more detail. A decoder 56 then decodes these codewords by use of the basic codeword portions according to the same code as applied by the encoder 14 of the transmitter 10. As particularly in case of mobile receivers severe disturbances, for instance due to the high velocity of the moving receiver, might appear a check unit 58 is provided in the receiver 50 by which it is checked if decoding has been made correctly and/or with sufficient quality and/or below a tolerable error level as will be explained below. If the decoding is made without errors or with sufficient quality the decoded data are provided to an output unit 60. The output thereof might be one or more receiver output data streams I1' I2', . . . , In' which should as much as possible correspond to the transmitter input data streams I1, I2, . . . , In. If, however, the check by check unit 58 shows that a decoding is erroneous or that the decoded data have an insufficient quality and would, for instance, result in a noisy receiver output signal (e.g. insufficient picture quality of a movie), a side loop 62 is provided from the check unit 58 to a unicast request unit 64 in order to request the auxiliary parity portion (generally, the auxiliary codeword portion) (completely or in part) for improving the quality of decoding.

Hence, in such a situation the unicast request unit 64 transmits a request R via the unicast system, i.e. via the unicast transmitter 100 of the data transmission system, to obtain the corresponding auxiliary parity portion (completely or in part) for the erroneously decoded codeword from the data storage 150. The request R includes at least the identification information of the erroneous codeword. In the meantime the decoding result C''' of decoding the codeword (or the codeword C' itself) is stored in a buffer (generally, a data memory unit) 66. The requested auxiliary codeword portion A' (or at least a portion thereof or another auxiliary parity data that can be used as incremental redundancy in an additional decoding step, i.e. which have been generated by use of the same code) is received by a unicast receiver 68. By use of this additional redundancy and the data stored in the buffer 66, a recombiner 69 will recombine these data so that the decoder 56 will then again decode the received codewords, but now applies a code having a lower code rate which thus has a higher robustness against the disturbances. Hence, there is a high likelihood that the decoding quality will be better than before.

Thereafter, again a check can be made by the check unit 58 if the decoding has now been made error-free or with sufficient quality, and, if not, a still further part of the auxiliary parity portion can be requested and used in another iteration of decoding. If, on the other hand, the complete auxiliary parity portion of a codeword has already been completely used for decoding the check can also be omitted and the decoded data can be outputted directly.

Preferably, the request R transmitted from the unicast request unit 64 comprises only an indication which auxiliary codeword portion is requested. However, an estimate E from the check unit 58 may also be included in the request R indicating the amount of incremental redundancy that is required for enabling better decoding of the codeword. Hence, based on said estimate E, the complete auxiliary codeword portion needs not necessarily to be retrieved and transmitted via the unicast system, but only the amount as signalled by said estimate E needs to be transmitted, thus saving bandwidth and transmission time (and, if the auxiliary parity portion must be generated on the fly in an auxiliary encoder 160, saving also some time needed for encoding).

Further, an identification (or address) information for uniquely identifying (or addressing) the requested data is generally included in the request R. As regards the addressing of codewords, in the context of DVB each physical layer pipe (PLP) can optionally use an Input Stream SYnchronization (ISSY) field, which is transmitted either in the BBHeader of each BBFrame (in the high efficiency mode, HEM) or appended after each user packet, which is the smallest unit of a transmission stream (in normal mode, NM). This ISSY field is mainly intended for ensuring a constant end-to-end delay of the system. The ISSY field (or more precisely the included ISCR=Input Stream Reference Field) carries the 15 or 22 LSB of a counter at the time the relevant input packet is processed. The counter is clocked by the input frequency RS=1/T, where T is e.g. 7/64 µs (see Annex C of the DVB-T2 standard [ETSI EN 302 755] for details).

Besides its main purpose for generating a constant end-to-end delay, it can also be used to identify data requested via the unicast transmitter 100 (preferably in addition to a PLP identifier). Therefore, the unicast request unit 64 may, in an embodiment, request the transmission of the auxiliary parity data between the ISCR timestamps of the fully decodable BBFrames of a specific PLP before and after the corrupted part. The detection that data is lost or corrupted within the receiver is generally not possible by means of the ISCR only. However, as the position and the length of the data are also signalled within the Layer 1 signalling, this task is possible.

As another option, it is also possible to use a counter that counts up one value each BBFrame of a PLP, instead of using the ISCR counter. Furthermore, it is also possible to use this mechanism on smaller entities than BBFrames. One possibility is e.g. the application of a MAC address. A counter then counts up each data part of a MAC address. If a part is missing, the receiver could request retransmission of this part.

Similarly as for the encoder 14 of the transmitter 10 there exist various embodiments of the decoder 56 of the receiver 50. A first embodiment 561 of the decoder 56 is schematically depicted in FIG. 16. According to this embodiment the decoder 561 comprises a first decoding unit 70 and a second decoding unit 80, similarly as the embodiment 142 of the encoder 14 depicted in FIG. 11. Further, an additional decoder 90 (e.g. a BCH decoder) is provided for BCH decoding the output of the decoder 561, if the corresponding transmitter used in the broadcast system applies a step of BCH encoding. The first decoding unit 70 generally corresponds to the decoding unit as used in receivers in accordance with the DVB-T2 standard. It comprises a time deinterleaver 71, a cell deinterleaver 72, a cyclic delay remover 73, a constellation demapper 74, a bit deinterleaver 75 and a first LDPC decoding block 76. Such a decoder is, for instance, explained in more detail in the DVB document A133, February 2009 "Implementation Guidelines for a Second Generation Digital Terrestrial Television Broadcast system (DVB-T2)" which is herein incorporated by reference. This first decoding unit 70 thus is provided with the data portions D' and the basic parity portions Pb' (generally the basic codeword portion B') as demapped by the demapper 54 from a received receiver input data stream O' and decodes, as usual, these codewords.

In addition, in this embodiment 561 of the decoder 56 a second decoding unit 80 is provided which a second decoding block 86, whose function is generally identical to the function of the first decoding block 76. The second decoding unit 80 is, however, provided with the output of the recombiner unit 69, i.e. in addition to the data portions D' and the basic parity portions Pb' (i.e. the codeword C' as input to the decoder 56) or in addition to the output C" of the first decoding unit 70, with the received additional auxiliary parity portion Pa' (generally the auxiliary codeword portion A') (completely or in part) for decoding the codewords with high reliability using said auxiliary parity portion Pa' as redundancy information. Hence, the second decoding unit 80 only becomes active in case of need, i.e. if the check unit 58 has found that the regular decoding has been erroneous and if auxiliary parity data have been received.

An alternative embodiment 562 of the decoder 56 as schematically depicted in FIG. 17 comprises only a single decoding unit 70a including the single decoding block 76a which is both able to decode the codewords according to the first code (with a higher code rate) based on only the data portion D' and the basic parity portion Pb' and according to the second code (with a lower code rate) using as redundancy information (part of or all of) the auxiliary parity portion Pa', if needed and requested. A standard LDPC decoder as, for instance, provided in a DVB-T2 receiver accepts at its input a (channel disturbed) codeword, as well as signalling information about the code rate and the length of the codewords (either 16200 or 64800 bits). Based on the signalling information, it applies an appropriate decoding algorithm (typically so called iterative message passing) based on that particular code realization and outputs an estimate of the data portion.

The same applies for an extended LDPC decoder included in the decoder 56, in particular the extended LDPC decoder 76/76a and 86, which receive in addition auxiliary codeword portion, in particular auxiliary parity bits. The number of auxiliary bits is generally signalled in addition to the applied code rate and the length of the basic codeword portion to the decoder. Given these parameters, the decoder 56 applies an appropriate decoding algorithm based on this extended (or "total") code.

A generic LDPC decoder has as input a received codeword (with or without additional parity bits) as well as signalling information about the code rate and the codeword length. The latter is in addition implicitly updated by the unicast receiver unit 68 and/or the recombiner unit 69, which signals, if (and how many) auxiliary parity bits have been received and are appended. The LDPC decoder in the decoder 56 according to the present disclosure may further output its estimates on each code bit of the (received) codeword C', i.e. an estimate C" on the codeword C'. Preferably, the bitwise estimates are expressed in terms of log likelihood ratios (LLRs), which is a soft information, whose magnitude reflects the reliability of the estimate.

If the check unit 58 decides that the estimate C" is probably the transmitted codeword C, it outputs the (hard decided) estimates of the data portion D' and sets a flag S to 1, which corresponds to a decoding success. Otherwise, S=0, which is signalled to the unicast request unit 64 to initiate the request of auxiliary parity bits (if still available). As mentioned above, the indicator E from the check unit 58 is optional and gives an estimate of how many additional auxiliary parity sub-portions are still needed. In case of E>1, the request R from the unicast request 64 can also include the estimate E.

The criteria for decoding success (S=1) are:
a) Within a maximum number of allowed decoder processing steps (typically a maximum number of iterations is imposed), a valid codeword C" (after hard decision) is found.
b) The estimate of the data portion D' (can be derived from the estimate C", or is even included in C", in case of a systematic code (as in DVB-T2)) can be decoded by a BCH decoder. Note that the BCH decoder has also some error detection capabilities.
c) After BCH decoding, the stream I1' should correspond to a BBFrame, whose header (BBHeader) is protected by a CRC. If this check is successful, the likelihood that the whole BBFrame is correct, is increased.
d) Preferably, the reliabilities of all LLRs (log-likelihood ratios) are checked by check unit 58. This could be done by averaging the magnitudes of all LLRs belonging to the codeword. If this average is larger than a certain threshold (which depends on the code and has to be defined), a decoding success is very likely.

If S=0, the last criterion (d) can also offer an estimate of how unreliable the codeword (after decoding) is. Assuming that the following auxiliary code portions have a similar quality than the previous codeword, an estimate E can be made about how many additional portions are needed for successful decoding.

It should be noted that there a two ways of combining the previous codeword (which the decoder wasn't able to decode correctly) with the auxiliary code word portions:
1) store the previous codeword, which entered the decoder, and append the auxiliary codeword portion at its end or
2) store the final estimate C" of the LDPC decoder 56 (e.g. after the maximum number of iterations has passed) and append the auxiliary codeword portion at its end.

In addition to the embodiments explained above the encoder of the transmitter may also be adapted such that the auxiliary parity portion (generally, the auxiliary codeword portion) may not (only) comprise "real" parity information, but that it may also comprise a repetition of (part of or all) of the information of the "basic" codeword, i.e. (some or all) bits of the data portion D and/or the basic parity portion Pb (i.e. of the basic codeword portion). Hence, in a very simple embodiment, the auxiliary parity portion Pa simply comprises a copy of the data portion D and/or the basic parity portion Pb. This will also improve decoding if the basic codeword is disturbed but the auxiliary parity portion is not (or less) disturbed. Further, even if both the basic codeword portion and the auxiliary codeword portion are disturbed, by use of both portions for decoding the result of the decoding may be improved, e.g. by applying the principle of soft combining, e.g. by improving the soft values obtained in a first decoding step using only the basic codeword portion in a second decoding step using in addition the auxiliary codeword portion.

Figure 18:
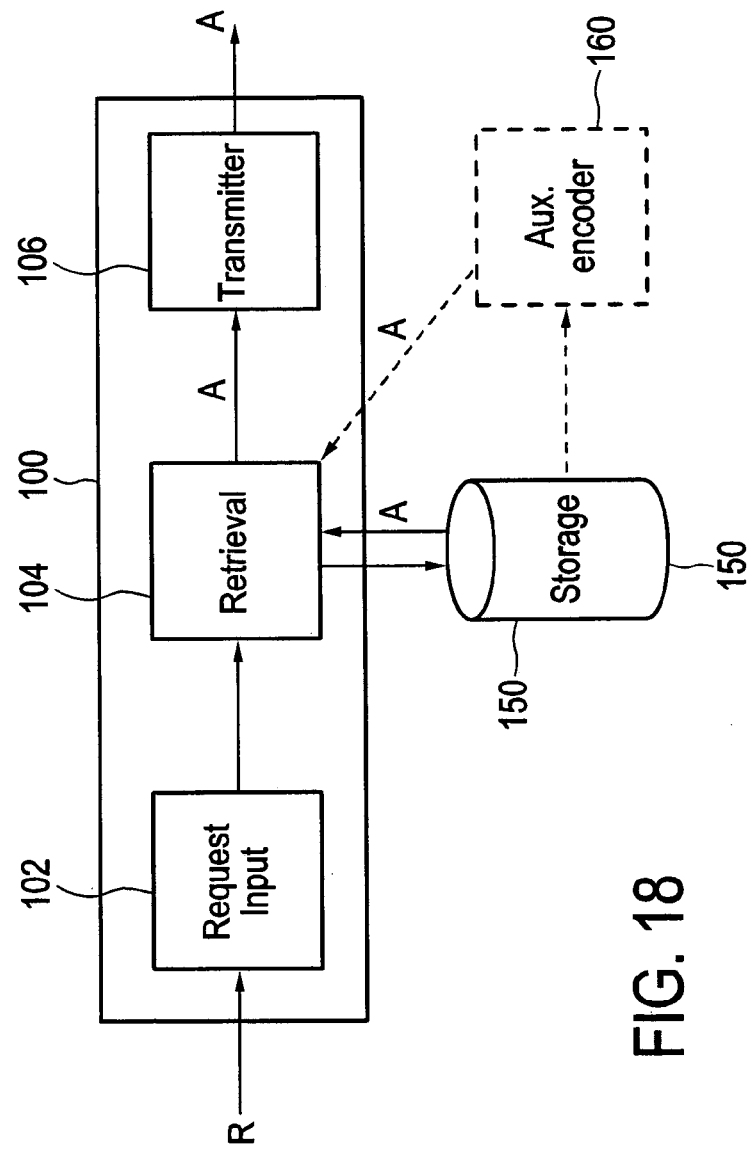
FIG. 18 shows a schematic block diagram of a unicast transmitter in accordance with the present disclosure.

FIG. 18 shows a schematic block diagram of an embodiment of a unicast transmitter 100 in accordance with the present disclosure. Said unicast transmitter 100 is preferably a device for receiving and transmitting data on a point-to-point connection directly between a transmitter and receiver and/or indirectly via a unicast system. Such a unicast system can, for instance, be a mobile communications system, such as a GSM, UMTS or LTE cellular mobile communications network, but can also be a wireless data network such as WLAN or WiMAX. Hence, the unicast transmitter 100 may be implemented as a base station that is able to transmit and receive data in such a unicast system. Alternatively, the unicast transmitter 100 may be implemented as a separate transmitter or a central station in the unicast system.

The general elements, system layout and functionalities of such a unicast transmitter 100 that enables the general function of transmitting and receiving data are not illustrated and explained hereinafter as these are generally known in the art and are well documented, for instance, in respective textbooks and/or standards, such as the GSM or 3GPP standards for a unicast transmitter 100 implemented as a base station in accordance with such a standard. Rather, the following description concentrates on the additional and/or modified elements and functionalities that are essential for the present invention.

The embodiment of the unicast transmitter 100 shown in FIG. 18 comprises a unicast request input 102 for receiving a unicast request R from the unicast request unit 64 (see FIG. 15) of a receiver 50. As explained above, by said request R, the unicast request unit 64 requests an auxiliary codeword portion A for use in an additional decoding step since regular decoding of the codeword has been erroneous. Said unicast request input 102 may be implemented in the receiving interface of the unicast transmitter 100, e.g. the receiving interface of a base station, which is thus also able to receive (and process) such a unicast request R. Accordingly, the unicast request unit 64 of the receiver 50 is appropriately adapted such that it is able to communicate with the unicast transmitter 100, in particular the request input 102. For instance, the unicast request unit 64 may be implemented as a transmission unit as commonly used in a unicast transmitter 100, e.g. a transmission unit as used in a base station.

The unicast transmitter 100 further comprises a retrieval unit 104 for retrieving the requested data. In particular, the retrieval unit 104 is adapted for obtaining an auxiliary codeword portion A in accordance with the request R. For this purpose, the retrieval unit 104 is able to access the data storage 150, in particular the buffer unit 153 at which data in accordance with the address information contained in the request R are stored. These data may directly be the auxiliary codeword portion A which is then read out from the buffer unit 153 by the retrieval unit 104 directly. As explained above, the data storage 150 may alternatively store the corresponding data input word D (and/or the basic codeword portion B), which corresponds to the data input word contained in the codeword that could not be correctly decoded so that the receiver 50 requested an auxiliary codeword portion by said request R. In this case, the input data word D (and/or the basic codeword portion B) is forwarded to the auxiliary encoder 160 which then encodes the data input word D (and/or the basic codeword portion B) to obtain the auxiliary codeword portion A (as requested), at least a part thereof or any other data that can be used as auxiliary codeword data for improving the quality of decoding the respective codeword. These data, i.e. in general the auxiliary codeword portion A, is then forwarded from the auxiliary encoder 160 to the retrieval unit 104.

The link between the retrieval unit 104 and the data storage 150 (and eventually the auxiliary encoder 160) can also be established via the unicast system, i.e. using the data receiving and transmitting means and functionalities that are generally available in the unicast transmitter 100 anyhow. Hence, for enabling this link, the data storage 150 (and eventually the auxiliary encoder 160) are provided with appropriate signal transmission and receiving means.

The obtained auxiliary codeword portion A is then forwarded to a unicast transmitter unit 106 for transmission back to the requesting receiver 50, in particular the unicast receiver unit 68, which thus is also provided with the appropriate functionality to receive these data from the unicast transmitter 100.

There are various embodiments to establish the link between the data stored in the memory unit 66 and the data received by the unicast receiver 68. One possibility is the transmission of the additional auxiliary codeword portions A' in IP packets on the unicast link 300. These auxiliary codeword portions A' are then passed to the recombiner unit 69, which converts the bits of the auxiliary codeword portions A' into LLR (Log Likelihood Ratio) values of very high confidence, e.g. 0→−100 and 1→100. Finally, the normal decoding is performed taking the auxiliary codeword portions A' and the data stored in the memory unit 66 as recombined data.

It shall be noted that generally unicast systems comprise sufficient means for error correction and detection and use means for ensuring safe receipt of data, in particular by using acknowledgement and non-acknowledgement messages. Generally, the transmitted data can be regarded as error-free in such a unicast system due to the high reliability of the applied error correction and detection means.

Hence, in view of the high reliability of the data received from the unicast transmitter 100 the recombiner unit 69 is preferably adapted for assigning an auxiliary reliability factor to said received data, i.e. the auxiliary codeword portion A', that is higher (in particular maximum) than the reliability of the respective basic codeword portion B'. The decoder 56 then takes said reliabilities into account in said additional decoding step, i.e. the received auxiliary codeword portion A' has a higher reliability than the basic codeword portion B' and the data C' or C" stored in the memory unit 66 as a result from the regular decoding step. Thereby, the decoding ability is much improved, because said high reliabilities of the auxiliary codeword portion A' acts as a bootstrapping mechanism in the message passing algorithm of the LDPC decoder. Thus, the other reliabilities will also increase.

The decoding success of the additional decoding step, based on the "total" codeword of the extended code, which has a smaller code rate than the code from the basic codeword, is more likely as the code is more powerful. If the decoder 56 operates with LLRs (log-likelihood ratios), and the code is binary (code symbols are code bits), these auxiliary LLRs are set in theory to plus/minus (depending on the value of the bit) infinity, and in practice (in hardware or software) to plus/minus times the maximum representable value.

Hence, according to the present disclosure the following measures increase the likelihood of a decoding success:
 Auxiliary codeword portions are available as incremental redundancy;
 Auxiliary codeword portions are available with very high reliability (most likely error-free); and
 (Optional) The amount of additional incremental redundancy was estimated by the check unit, such that given these additional portions and given the same channel behaviour, a decoding success is very likely.

In the above, particularly with respect to the transmitter 10, various embodiments have been illustrated, particularly how the data portions and the basic parity portions are mapped onto the transmitter output data stream. Further, various examples have been given regarding the framing structure of the transmitter output data stream. It shall be understood that the data demapper 54 of the receiver 50 is, of course, adapted appropriately for demapping the required data from the receiver data input stream, i.e. the demapper 54 is aware of the particular framing structure and/or the locations at which the respective data are placed in the receiver data input stream. Known measures for signalling this information to the receiver from the transmitter and/or for prescribing this information, for instance in a standard, and for enabling the transmitters and receivers accordingly are generally applied to ensure this.

The framing structure applied according to the present disclosure may generally be adapted to be in consistence with the framing structure according to an existing standard, e.g. the DVB-T2 standard, so that existing receivers in accordance with this standard may also receive and process such data streams, even if they do not make use of ability of requesting auxiliary parity information as incremental redundancy. However, the framing structure may be freely selected and newly created according to specific needs of the broadcast system.

Generally, the present invention can be applied in all data transmission systems, by which data are transmitted over a channel. For instance, the invention can be applied in a DVB systems, but also in other systems like DAB systems as described in the DAB standard (ETS 300 401 "Radio broadcast systems; Digital Audio Broadcasting (DAB) to mobile, portable and fixed receivers", May 1997, RE/JPT-00DAB-4) or in other broadcast scenarios (e.g. MediaFLO), in which data is transmitted with a unique address. Even if the broadcast does not (yet) transmit data with addresses, the broadcast might be adapted such that it does. Certainly, if IP packets are broadcast with a unique MAC address, the invention is applicable without changing the transmitted data itself.

In the context of LTE (Long Term Evolution), the unicast request unit 64 and the unicast receiver unit 68 are part of a user equipment (UE), e.g. a mobile phone in accordance with the LTE standard, which transmits the request R in the uplink to the base station (eNodeB in the context of LTE), i.e. the unicast transmitter, via the PUSCH (Physical Uplink Shared CHannel). The eNodeB is connected with the EPC (Evolved Packet Core Network), which in turn establishes a connection to the data storage 150, e.g. over the internet. The request R and the auxiliary codeword portion A may transmitted in such a unicast system as payload of the communication between the UE and the eNodeB (and the other instances taking part in the communication) generally using the same channels as normally used for communications established when the UE connects to the internet to obtain particular data. As all these details are generally known in the art and are well described in textbooks about LTE (e.g. in "LTE for UMTS—OFDMA and SC-FDMA Based Radio Access", H. Holma and A. Toskala, J. Wiley & Sons Ltd., 2009, the generally layout being particularly shown in section 3.2.1 or "3GPP TS 36.211 V.9.0.0 (2009-12), 3rd Generation Partnership Project; Technical Specification Group Radio Access Network; Evolved Universal Terrestrial Radio Access (E-UTRA); Physical Channels and Modulation (Release 9))", so that it is refrained here from describing all these generally known details.

In the context of WLAN the unicast request unit 64 and the unicast receiver unit 68 are part of a device, e.g. a mobile phone or PDA, that has the ability to connect to a WLAN router, which serves as the unicast transmitter. Via the WLAN router the request R is sent through the internet to the data storage 150 and the retrieved auxiliary codeword portion A is delivered back to the receiver 50. Again, as the general functionalities and layout of a WLAN system are generally known and well described, these details are not described here.

The present disclosure thus provides an effective and easily implementable measure for improving the reliability of decoding, particularly for mobile receivers in a broadcast system and for non-real-time applications. The disclosure does, of course, not only enable an improved decoding of single codewords, but allows option for whole data streams. Hence, the buffer data storage is large enough for storing a large number of auxiliary data for a large number of codewords, and also the buffer in a receiver is large enough for buffering not only a single erroneously decoded codeword (or soft information) but a large number.

Obviously, numerous modifications and variations of the present disclosure are possible in light of the above teachings. It is therefore to be understood that within the scope of the appended claims, the invention may be practiced otherwise than as specifically described herein.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the invention have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present invention. Further, such a software may also be distributed in other forms, such as via the Internet or other wired or wireless telecommunication systems.

The invention claimed is:

1. A receiver comprising:
   circuitry configured to
   receive an input data stream segmented into frames, each frame including basic codeword portions of codewords mapped onto said frames, each codeword comprising at least one of the basic codeword portions generated from an input data word according to a first code;
   de-map the basic codeword portions from said frames of the receiver input data stream;
   decode said codewords into output data words of at least one output data stream in a regular decoding by decoding the at least one of the basic codeword portions;
   check whether the regular decoding of a codeword is erroneous;
   when said regular decoding of a codeword is erroneous:
     estimate an amount of incremental redundancy that is required to correctly decode the codeword;
     request through a unicast system an auxiliary codeword portion that provides at least said estimated amount of incremental redundancy, the auxiliary codeword portion being of the codeword in which the regular decoding is erroneous;
     receive from said unicast system the auxiliary codeword portion; and
     decode the codeword in which the regular decoding is erroneous by using the auxiliary codeword portion; and
   output said at least one receiver output data stream segmented into said decoded output data words.

2. The receiver as claimed in claim 1, wherein when said regular decoding of a codeword is erroneous, the circuitry is further configured to
   request said auxiliary codeword portion from a communications system, a mobile communications system or a wireless LAN, and receive the auxiliary codeword portion from the communications system, the mobile communications system or the wireless LAN.

3. The receiver as claimed in claim 1,
wherein the circuitry is further configured to receive the input data stream in accordance with a DVB broadcast system.

4. The receiver as claimed in claim 1, wherein the circuitry is further configured to
decode, according to said first code, the input data word from a basic codeword including at least one of the basic codeword portions, and
decode, according to a second code, the input data word from an auxiliary codeword including at least one of the basic codeword portions and said auxiliary codeword portion.

5. A receiver as claimed in claim 1, wherein the circuitry is further configured to decode, according to said first code, the input data word from a basic codeword including said basic codeword portion and decode, according to said second code, the input data word from an auxiliary codeword including said basic codeword portion and said auxiliary codeword portion.

6. The receiver as claimed in claim 1,
wherein the circuitry is further configured to stepwise request sub-portions of the auxiliary codeword portion for use as incremental redundancies when the regular decoding of the codeword is erroneous.

7. The receiver as claimed in claim 1,
wherein the circuitry is further configured to store the basic codeword portion or a decoding result of the regular decoding when the regular decoding of the codeword is erroneous until the auxiliary codeword portion is received through said unicast system.

8. The receiver as claimed in claim 7,
wherein the circuitry is further configured to recombine the auxiliary codeword portion with the stored information, and provide the recombined information for decoding.

9. The receiver as claimed in claim 8, wherein the circuitry is further configured to
assign an auxiliary reliability factor to said auxiliary codeword portion that is higher than a reliability of the at least one basic codeword portion, and
consider said auxiliary reliability factor in said additional decoding.

10. The receiver as claimed in claim 1, wherein the circuitry is further configured to include a codeword identification information into the request for an auxiliary codeword portion, said codeword identification information identifying the erroneously decoded codeword in the receiver input data stream.

11. The receiver as claimed in claim 1,
wherein the circuitry is further configured to include, as codeword address information in the request, a frame indicator, a data block indication, a synchronization information a counter, or an ISSY field and a physical layer pipe identifier of the receiver input data stream in accordance with a DVB broadcast system.

12. The receiver as claimed in claim 1,
wherein the circuitry is further configured to apply a systematic code to decode said codewords such that said basic codeword portion comprises a data portion, or the input data word, and a basic parity portion, and said auxiliary codeword portions comprise an auxiliary parity portion.

13. A receiving method for receiving data, the method comprising:

receiving an input data stream segmented into frames, each frame including basic codeword portions of codewords mapped onto said frames, each codeword comprising at least one of the basic codeword portions generated from an input data word according to a first code;
demapping the basic codeword portions from said frames of the receiver input data stream;
decoding said codewords into output data words of at least one output data stream in a regular decoding by decoding the at least one of the basic codeword portions;
checking whether the regular decoding of a codeword is erroneous;
when said regular decoding of a codeword is erroneous:
estimating an amount of incremental redundancy that is required to correctly decode the codeword;
requesting, through a unicast system, an auxiliary codeword portion that provides at least said estimated amount of incremental redundancy, the auxiliary codeword portion being of the codeword in which the regular decoding is erroneous;
receiving from said unicast system the auxiliary codeword portion; and
decoding the codeword in which the regular decoding is erroneous by using the auxiliary codeword portion; and
outputting said at least one receiver output data stream segmented into said decoded output data words.

14. A non-transitory computer-readable medium that stores a computer program which, when executed by a processor, executes the receiving method of claim 13.

15. A data transmission system for transmitting and receiving data comprising:
a receiver as claimed in claim 1;
a broadcast transmitter for broadcasting data comprising:
a data input for receiving at least one transmitter input data stream segmented into the input data words;
an encoder for encoding the input data words into the codewords, wherein said encoder is adapted to generate said basic codeword portion from the input data word according to the first code, said basic codeword portion provided for regular decoding;
a data mapper for mapping the codewords onto the frames of a transmitter output data stream; and
a broadcasting unit for broadcasting said transmitter output data stream;
a data storage for storing said input data words, said basic codeword portions or the auxiliary codeword portions generated from the input data word according to a second code, said auxiliary codeword portion being provided as an incremental redundancy when the regular decoding of the codeword is erroneous; and
a unicast transmitter for transmitting data in the unicast system comprising:
a unicast request input for receiving a unicast request requesting the auxiliary codeword portion;
a retrieval unit for retrieving the auxiliary codeword portion from said data storage or from an auxiliary encoder adapted for error correction code encoding the input data word or the basic codeword portion retrieved from said data storage into said auxiliary codeword portion; and
a unicast transmitter unit for transmitting said auxiliary codeword portion to the requesting receiver.

16. A data transmission system as claimed in claim 15, further comprising an auxiliary encoder adapted for error correction code encoding the input data word retrieved from said data storage into said auxiliary codeword portion.

17. A data transmission method for transmitting and receiving data comprising:
  the receiving method as recited in claim 13;
  broadcasting data comprising:
    receiving at least one transmitter input data stream segmented into the input data words;
    encoding the input data words into the codewords, wherein said basic codeword portion is generated from the input data word according to the first code, said basic codeword portion provided for regular decoding;
    mapping the codewords onto the frames of a transmitter output data stream; and
    broadcasting said transmitter output data stream;
    storing said input data words, said basic codeword portions or the auxiliary codeword portions generated from the input data word according to a second code, said auxiliary codeword portion being provided as an incremental redundancy when regular decoding of the codeword is erroneous; and
  transmitting data in the unicast system comprising:
    receiving a unicast request requesting the auxiliary codeword portion;
    retrieving the auxiliary codeword portion from said data storage or from an auxiliary encoder adapted for error correction code encoding the input data word or the basic codeword portion retrieved from said data storage into said auxiliary codeword portion; and
    transmitting said auxiliary codeword portion to the requesting receiver.

* * * * *